(12) United States Patent
Kobayashi et al.

(10) Patent No.: US 12,167,154 B2
(45) Date of Patent: Dec. 10, 2024

(54) COMPARATOR, AD CONVERTER, PHOTOELECTRIC CONVERSION DEVICE, IMAGING SYSTEM, AND MOVABLE OBJECT

(71) Applicant: CANON KABUSHIKI KAISHA, Tokyo (JP)

(72) Inventors: Hideo Kobayashi, Tokyo (JP); So Hasegawa, Kanagawa (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 82 days.

(21) Appl. No.: 18/148,137

(22) Filed: Dec. 29, 2022

(65) Prior Publication Data

US 2023/0132676 A1 May 4, 2023

Related U.S. Application Data

(62) Division of application No. 17/166,346, filed on Feb. 3, 2021, now abandoned.

(30) Foreign Application Priority Data

Feb. 26, 2020 (JP) .................................. 2020-030610

(51) Int. Cl.
*H04N 25/75* (2023.01)
*B60R 16/023* (2006.01)
(Continued)

(52) U.S. Cl.
CPC ......... *H04N 25/75* (2023.01); *B60R 16/0231* (2013.01); *G06T 7/55* (2017.01);
(Continued)

(58) Field of Classification Search
CPC ........ H04N 25/75; H04N 25/79; H04N 25/78; B60R 16/0231; G06T 7/55;
(Continued)

(56) References Cited

U.S. PATENT DOCUMENTS

| 4,438,349 A | 3/1984 | Shoji |
|---|---|---|
| 7,191,457 B2 | 3/2007 | Saito |

(Continued)

FOREIGN PATENT DOCUMENTS

| CN | 102209209 A | 10/2011 |
|---|---|---|
| CN | 102917182 A | 2/2013 |

(Continued)

OTHER PUBLICATIONS

Chinese Office Action issued in corresponding Chinese Application No. 2021102023474.4 (English Translation Not Available).

(Continued)

*Primary Examiner* — Michael E Teitelbaum
(74) *Attorney, Agent, or Firm* — VENABLE LLP

(57) ABSTRACT

A disclosed comparator includes a comparison circuit including a differential unit that compares an input signal with a reference signal and changes a level of a signal output to a first node in accordance with a result of comparison and an amplifier unit that includes a load element and outputs a signal in accordance with a potential of the first node to a second node, and a positive feedback circuit that is connected to the second node and a third node and changes a level of a signal at the third node at a rate higher than a change rate of a level of a signal at the second node in accordance with a change in a level of a signal at the second node.

48 Claims, 26 Drawing Sheets

(51) Int. Cl.
    *G06T 7/55*    (2017.01)
    *H03K 5/24*    (2006.01)
    *H03M 1/06*    (2006.01)
    *H04N 25/79*   (2023.01)

(52) U.S. Cl.
    CPC ........ *H03K 5/2481* (2013.01); *H03M 1/0607* (2013.01); *H04N 25/79* (2023.01); *G06T 2207/30252* (2013.01)

(58) Field of Classification Search
    CPC ....... G06T 2207/30252; H03K 5/2481; H03M 1/0607; H03M 1/0845; H03M 1/123; H03M 1/124; H03M 1/56; H03F 2203/45674; H03F 3/082; H03F 3/45183
    See application file for complete search history.

(56) References Cited

U.S. PATENT DOCUMENTS

| | | | |
|---|---|---|---|
| 8,259,196 | B2 | 9/2012 | Yoshikawa |
| 9,270,905 | B2 | 2/2016 | Ogura |
| 9,635,298 | B2 | 4/2017 | Nakamura |
| 9,947,615 | B2 | 4/2018 | Kobayashi |
| 10,075,155 | B2 | 9/2018 | Kikuchi |
| 10,244,158 | B2 | 3/2019 | Fujii |
| 10,290,673 | B1 | 5/2019 | Wang |
| 10,504,831 | B2 | 12/2019 | Kobayashi |
| 10,707,852 | B2 | 7/2020 | Sakakibara |
| 2004/0046592 | A1* | 3/2004 | Nakajima ........... H03F 3/45085 327/52 |
| 2018/0013412 | A1 | 1/2018 | Kikuchi |
| 2018/0262203 | A1 | 9/2018 | Yang |
| 2019/0207596 | A1* | 7/2019 | Sakakibara ............ H04N 25/75 |
| 2021/0041305 | A1* | 2/2021 | Kawazu .................. G06K 7/01 |
| 2021/0067168 | A1 | 3/2021 | Kitano |

FOREIGN PATENT DOCUMENTS

| | | |
|---|---|---|
| CN | 103259509 A | 8/2013 |
| CN | 106899814 A | 6/2017 |
| JP | 55-41016 A | 3/1980 |
| JP | 57-75022 A | 5/1982 |
| JP | 6-109779 A | 4/1994 |
| JP | 2010-16656 A | 1/2010 |
| JP | 2013-187815 A | 9/2013 |
| JP | 2015-211234 A | 11/2015 |
| JP | 2017-5443 A | 1/2017 |
| JP | 2019-134230 A | 8/2019 |
| WO | 2014/038140 A | 3/2014 |
| WO | 2016/136448 A | 9/2016 |
| WO | 2018/037901 A | 3/2018 |

OTHER PUBLICATIONS

Japanese Office Action issued in corresponding Japanese Application No. 2020-030610 dated May 17, 2022 (English Translation Included—cited during prosecution of parent U.S. Appl. No. 17/166,346).

Japanese Office Action issued in corresponding Japanese Application No. 2020-030610 dated Aug. 18, 2022 (English Translation Included—cited during prosecution of parent U.S. Appl. No. 17/166,346).

* cited by examiner

COMPARATOR, AD CONVERTER, PHOTOELECTRIC CONVERSION DEVICE, IMAGING SYSTEM, AND MOVABLE OBJECT

This application is a divisional of U.S. application Ser. No. 17/166,346, filed Feb. 3, 2021, currently pending; and claims priority under 35 U.S.C. § 119 to Japanese Application JP 2020-030610, filed Feb. 26, 2020; the contents of each of which are incorporated by reference herein.

BACKGROUND OF THE INVENTION

Field of the Invention

The present invention relates to a comparator, an AD converter, a photoelectric conversion device, an imaging system, and a movable object.

Description of the Related Art

An imaging device on which a column-parallel analog-to-digital (AD) converter including AD conversion units on a pixel column basis is mounted is proposed. A typical column-parallel AD converter performs AD conversion on a pixel signal by using a comparator to compare a pixel signal with a reference signal whose level changes with time and counting the time from start of the comparison to inversion of the output signal of the comparator. International Publication No. WO2018/037901 discloses an imaging device including a comparator including a positive feedback circuit used for increasing the transition rate when an output signal is inverted.

In the conventional comparator, however, a malfunction may occur due to variation of element characteristics or the like. Thus, when an AD conversion circuit is formed using such a comparator, an AD conversion error may occur.

SUMMARY OF THE INVENTION

The object of the present invention is to provide a comparator that may suppress a malfunction due to variation of element characteristics or the like and an AD converter, a photoelectric conversion device, and an imaging system using such a comparator.

According to one aspect of the present invention, provided is a comparator including a comparison circuit including a differential unit that compares an input signal with a reference signal and changes a level of a signal output to a first node in accordance with a result of comparison and an amplifier unit that includes a load element and outputs a signal in accordance with a potential of the first node to a second node, and a positive feedback circuit that is connected to the second node and a third node and changes a level of a signal at the third node at a rate higher than a change rate of a level of a signal at the second node in accordance with a change in a level of a signal at the second node.

Further, according to another aspect of the present invention, provided is an analog-to-digital converter including the comparator described above, and a counter circuit that outputs, as digital data of the input signal, a count value in accordance with a length of a period from start of comparison between the input signal and the reference signal to a change of a level of the signal output to the first node.

Further, according to yet another aspect of the present invention, provided is a photoelectric conversion device including a plurality of pixels arranged so as to form a plurality of rows and a plurality of columns and each including a photoelectric converter, a plurality of output lines each arranged on each of the plurality of columns and each connected to pixels on a corresponding column, and a plurality of analog-to-digital converters described above each connected to each of the plurality of output lines and configured to perform analog-to-digital conversion on pixel signals output from the pixels on a corresponding column.

Further features of the present invention will become apparent from the following description of exemplary embodiments with reference to the attached drawings.

DESCRIPTION OF THE EMBODIMENTS

Preferred embodiments of the present invention will now be described in detail in accordance with the accompanying drawings.

First Embodiment

Figure 1:
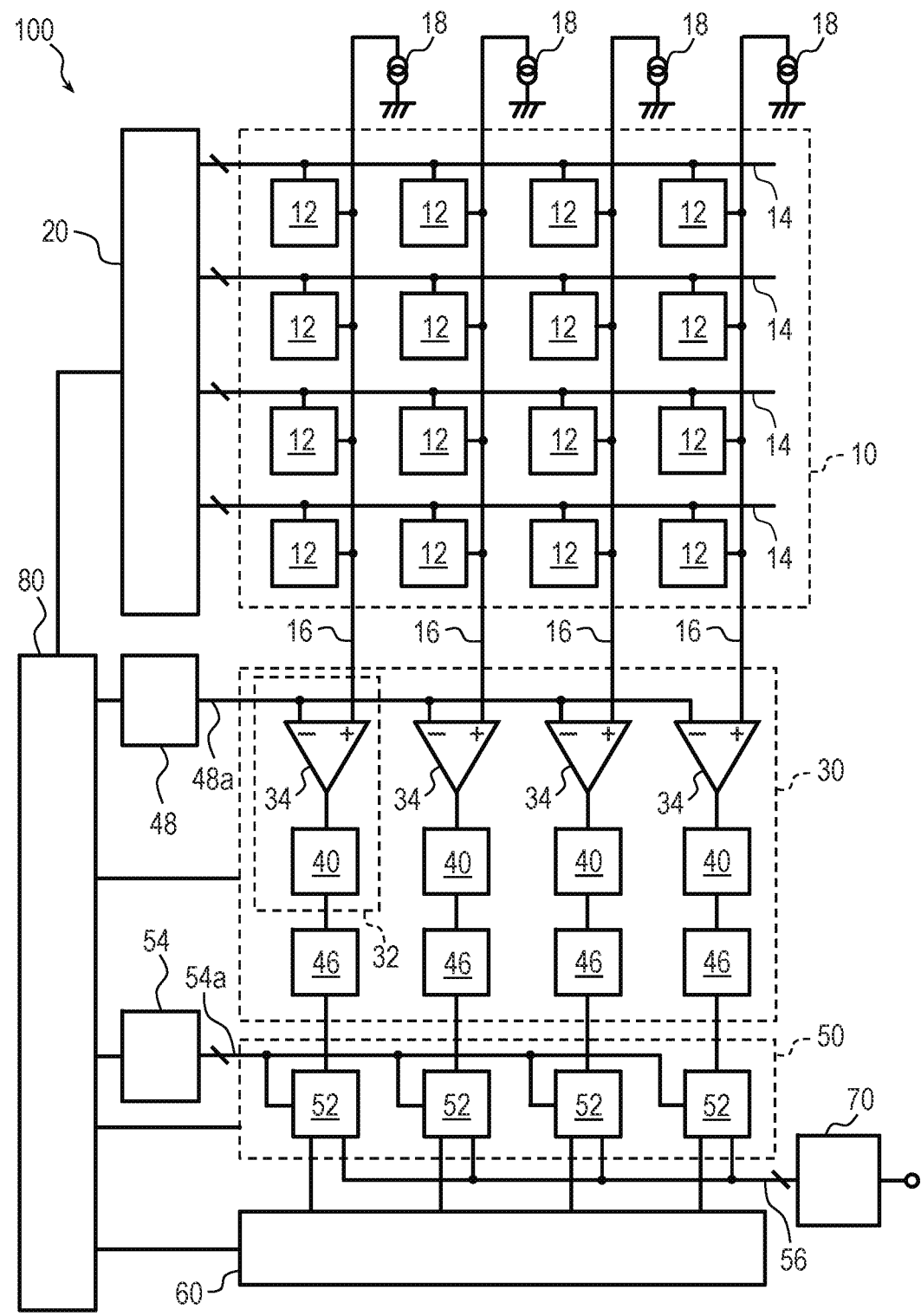
FIG. 1 is a block diagram illustrating a general configuration of a photoelectric conversion device according to a first embodiment of the present invention.

The general configuration of a photoelectric conversion device according to a first embodiment of the present invention will be described with reference to FIG. 1. FIG. 1 is a block diagram illustrating a general configuration of the photoelectric conversion device according to the present embodiment.

As illustrated in FIG. 1, a photoelectric conversion device 100 according to the present embodiment includes a pixel array unit 10, a vertical scanning circuit 20, an AD conversion circuit unit 30, a reference signal generation circuit 48, a memory unit 50, a counter circuit 54, a horizontal scanning circuit 60, an output circuit 70, and a control circuit 80.

In the pixel array unit 10, a plurality of pixels 12 arranged in a matrix over a plurality of rows and a plurality of columns are provided. Although FIG. 1 illustrates 16 pixels 12 arranged on four rows by four columns out of the pixels 12 forming the pixel array unit 10, the number of pixels 12 forming the pixel array unit 10 is not particularly limited.

On each row of the pixel array unit 10, a control line 14 is arranged extending in a first direction (horizontal direction in FIG. 1). Each of the control lines 14 is connected to the pixels 12 aligned in the first direction, respectively, to form a signal line common to these pixels 12. The first direction in which the control line 14 extends may be referred to as a row direction or the horizontal direction. The control lines 14 are connected to the vertical scanning circuit 20.

On each column of the pixel array unit 10, an output line 16 is arranged extending in a second direction (vertical direction in FIG. 1) crossing the first direction. Each of the output lines 16 is connected to the pixels 12 aligned in the second direction, respectively, to form a signal line common to these pixels 12. The second direction in which the output line 16 extends may be referred to as a column direction or the vertical direction. The output lines 16 are connected to the AD conversion circuit unit 30. A current source 18 used for supplying bias current to readout circuits in the pixels 12 is connected to the output line 16.

The vertical scanning circuit 20 is a control circuit unit that supplies control signals to the pixels 12 via the control line 14 provided on each row of the pixel array unit 10, and the control signals are used for driving readout circuits in the pixels 12 when reading out signals from the pixels 12. The vertical scanning circuit 20 may be formed using a shift register or an address decoder.

The AD conversion circuit unit 30 includes a plurality of comparators 32 and a plurality of pulse generators 46 in association with each column of the pixel array unit 10. Each of the plurality of comparators 32 includes a comparison circuit 34 and a positive feedback circuit 40. The comparison circuit 34 is formed of a differential pair circuit, for example, and has two input nodes (a non-inverting input terminal (+) and an inverting input terminal (−)) and one output node. The non-inverting input terminal of the comparison circuit 34 is connected to the output line 16 on a corresponding column. The inverting input terminal of the comparison circuit 34 is connected to a reference signal generation circuit 48 via a reference signal line 48a common to respective columns. The output node of the comparison circuit 34 is connected to the input node of the positive feedback circuit 40. The output node of the positive feedback circuit 40 is connected to the input node of the pulse generator 46. A known one-shot pulse generation circuit that outputs one shot of pulse upon detecting a rising edge or a falling edge of an input signal is applicable to the pulse generator 46. Note that the specific configuration and operation of the comparator 32 will be described later.

The reference signal generation circuit 48 supplies a reference signal having a predetermined amplitude to the comparator 32 on each column via the reference signal line 48a. The reference signal may be a signal whose signal level (magnitude of the signal) changes with time, for example. Typically, the reference signal is a ramp signal. The ramp signal is a signal whose signal level monotonically changes with time, which is a signal whose output voltage monotonically decreases or monotonically increases with time, for example. Note that the reference signal is not particularly limited as long as it has an amplitude that is applicable to AD conversion. The operation of the reference signal generation circuit 48 is controlled by the control circuit 80.

The memory unit 50 includes a plurality of memories 52 in association with each column of the pixel array unit 10. Each of the plurality of memories 52 may include an N-memory (not illustrated) that holds digital data for a noise signal and an S-memory (not illustrated) that holds digital data for a light detection signal. Each of the plurality of memories 52 has two input nodes, one output node, and one control node. One of the input nodes of the memory 52 is connected to the output node of the pulse generator 46 on a corresponding column. The other input node of the memory 52 is connected to the counter circuit 54 via a count signal line 54a common to respective columns. The output node of the memory 52 is connected to a horizontal output line 56. The control node of the memory 52 is connected to the horizontal scanning circuit 60.

The counter circuit 54 starts a count operation in synchronization with a timing of start of a change in a signal level of a reference signal output from the reference signal generation circuit 48 and outputs a count signal indicating the count value to the memory 52 on each column.

The horizontal scanning circuit 60 is a circuit unit that supplies control signals to the memories 52 on respective columns sequentially on a column basis, and the control signals are used for outputting pixel signals stored in the memories 52 on respective columns. Control lines of the horizontal scanning circuit 60 provided in association with respective columns of the pixel array unit 10 are connected to the memories 52 on corresponding columns. In response to receiving a control signal via the control line on a corresponding column of the horizontal scanning circuit 60, the memory 52 on each column outputs the held pixel signal to the output circuit 70 via the horizontal output line 56.

The output circuit 70 is a circuit unit that performs predetermined signal processing on a signal on a column selected by the horizontal scanning circuit 60 and outputs the signal to the external of the photoelectric conversion device 100. The output circuit 70 includes a signal processing unit formed of a buffer amplifier, a differential amplifier, or the like and performs signal processing such as an amplification process, a digital correlated double sampling (CDS) process, or the like. The digital CDS process is signal processing that performs a differential process of (S−N) when the memory 52 stores two types of digital data, namely, a noise signal N and a light detection signal S as a pixel signal. Further, the output circuit 70 further includes an external interface such as Low Voltage Differential Signaling (LVDS) and outputs a digital signal obtained after signal processing to the external of the photoelectric conversion device 100.

The control circuit 80 is a circuit unit used for supplying control signals to the vertical scanning circuit 20, the AD conversion circuit unit 30, the reference signal generation circuit 48, the memory unit 50, the counter circuit 54, and the horizontal scanning circuit 60, and the control signals are used for controlling the operations of the above components and the timings thereof. Some or all of the control signals supplied to vertical scanning circuit 20, the AD conversion circuit unit 30, the reference signal generation circuit 48, the memory unit 50, the counter circuit 54, and the horizontal scanning circuit 60 may be supplied from the external of the photoelectric conversion device 100.

Figure 2:
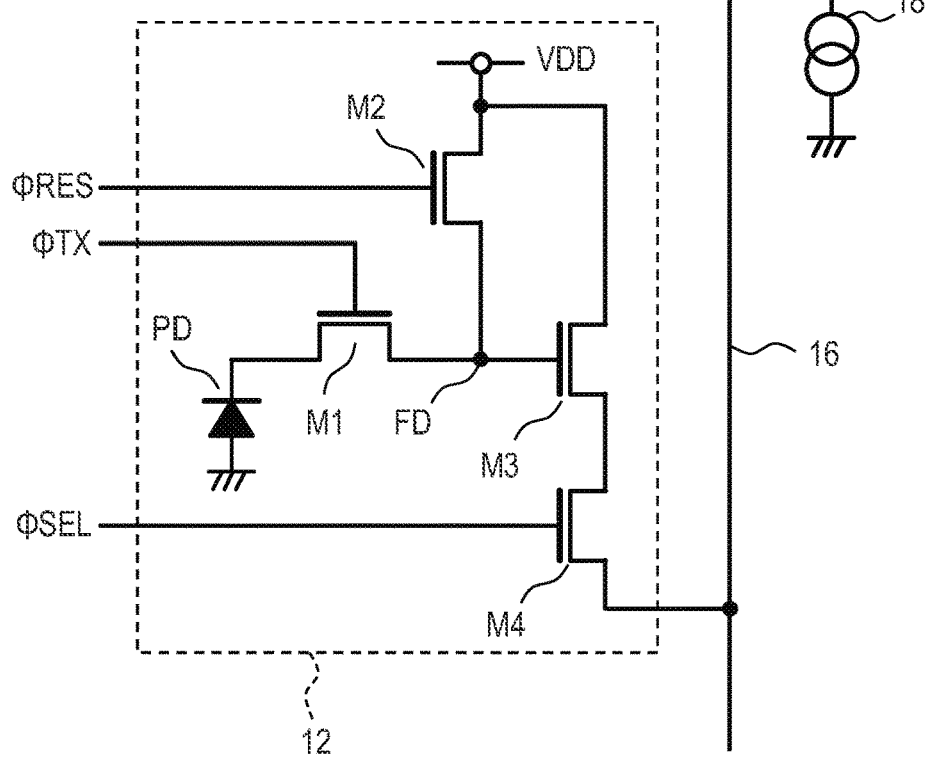
FIG. 2 is a circuit diagram illustrating a configuration example of a pixel in the photoelectric conversion device according to the first embodiment of the present invention.

Next, a configuration example of a pixel in the photoelectric conversion device according to the present embodiment will be described with reference to FIG. 2. FIG. 2 is a circuit diagram illustrating a configuration example of the pixel in the photoelectric conversion device according to the present embodiment.

Each of the pixels 12 may be formed of a photoelectric converter PD, a transfer transistor M1, a reset transistor M2, an amplifier transistor M3, and a select transistor M4, as illustrated in FIG. 2, for example.

The photoelectric converter PD is a photodiode, for example, the anode thereof is connected to a reference voltage node, and the cathode thereof is connected to the source of the transfer transistor M1. The drain of the transfer transistor M1 is connected to the source of the reset transistor M2 and the gate of the amplifier transistor M3. The connection node of the drain of the transfer transistor M1, the source of the reset transistor M2, and the gate of the amplifier transistor M3 is a so-called floating diffusion portion FD. The floating diffusion portion FD includes a capacitance component (floating diffusion capacitance) and has a function as a charge holding portion.

The drain of the reset transistor M2 and the drain of the amplifier transistor M3 are connected to the power supply voltage node to which a power supply voltage VDD is supplied. The source of the amplifier transistor M3 is connected to the drain of the select transistor M4. The source of the select transistor M4 is connected to the output line 16. The output line 16 is connected to the current source 18.

Note that the pixel 12 is not necessarily required to have the select transistor M4 and may have a pixel configuration not including the select transistor M4. In such a case, the source of the amplifier transistor M3 is connected to the output line 16.

In the case of the pixel configuration of FIG. 2, the control line 14 on each row arranged in the pixel array unit 10 includes signal lines TX, RES, and SEL. The signal line TX is connected to the gates of the transfer transistors M1 of the pixels 12 belonging to a corresponding row, respectively, to form a signal line common to these pixels 12. The signal line RES is connected to the gates of the reset transistors M2 of the pixels 12 belonging to a corresponding row, respectively, to form a signal line common to these pixels 12. The signal line SEL is connected to the gates of the select transistors M4 of the pixels 12 belonging to a corresponding row, respectively, to form a signal line common to these pixels 12.

A control signal ΦTX that is a drive pulse used for controlling the transfer transistor M1 is supplied to the signal line TX from the vertical scanning circuit 20. A control signal ΦRES that is a drive pulse used for controlling the reset transistor M2 is supplied to the signal line RES from the vertical scanning circuit 20. A control signal ΦSEL that is a drive pulse used for controlling the select transistor M4 is supplied to the signal line SEL from the vertical scanning circuit 20. When each transistor is formed of an n-channel transistor, a corresponding transistor is turned on in response to a control signal at a High level (hereafter, denoted as "H level") being supplied from the vertical scanning circuit 20. Further, a corresponding transistor is turned off in response to a control signal at a Low level (hereafter, denoted as "L level") being supplied from the vertical scanning circuit 20.

Next, the overview of the operation of the imaging device according to the present embodiment will be described with reference to FIG. 1 and FIG. 2.

Once light enters the pixel array unit 10, the photoelectric converter PD of each pixel 12 converts (photoelectrically converts) the incident light into an amount of charge in accordance with the light amount and accumulates the generated charge. When turned on, the transfer transistor M1 transfers charge held by the photoelectric converter PD to the floating diffusion portion FD. The floating diffusion portion FD holds charge transferred from the photoelectric converter PD and has a voltage in accordance with the amount of the charge transferred from the photoelectric converter PD due to charge-voltage conversion caused by the capacitance of the floating diffusion portion FD.

The amplifier transistor M3 is configured such that the power supply voltage VDD is supplied to the drain and bias current is supplied to the source from the current source 18 via the select transistor M4 and forms an amplifier unit (source follower circuit) whose gate is the input node. Accordingly, the amplifier transistor M3 outputs a signal based on the voltage of the floating diffusion portion FD to the output line 16 via the select transistor M4. In this sense, the amplifier transistor M3 also serves as an output unit that outputs a pixel signal based on charge held by the floating diffusion portion FD. When turned on, the reset transistor M2 resets the floating diffusion portion FD to a voltage in accordance with the power supply voltage VDD. Note that, in this specification, a signal output to the output line 16 when the floating diffusion portion FD is in a reset state is referred to as a noise signal, and a signal output to the output line 16 in a state where the floating diffusion portion FD holds signal charge is referred to as a light detection signal.

The transfer transistor M1, the reset transistor M2, and the select transistor M4 of the pixel 12 are controlled on a row basis by the control signals ΦTX, ΦRES, and ΦSEL supplied from the vertical scanning circuit 20, as described above. Pixel signals of the pixels 12 belonging to a row selected by the control signal ΦSEL are simultaneously output to the output line 16 which respective pixels 12 correspond to.

The comparator 32 on each column compares the level of a pixel signal read out from the pixel on a corresponding column via the output line 16 with the reference signal supplied from the reference signal generation circuit 48 and outputs a signal in accordance with a result of the comparison to the pulse generator 46. Specifically, the comparator 32 compares the magnitude of a pixel signal (signal SIG) with the magnitude of the reference signal (reference signal RAMP) and changes the level of the output signal at a timing when the level relationship between these signals is inverted. The pulse generator 46 outputs one shot of pulse in response to a change of the level of the output signal of the comparator 32.

The counter circuit 54 starts count from the start of comparison of a pixel signal with the reference signal and outputs a count signal indicating a count value to the memory 52 on each column via the count signal line 54a. The memory 52 on each column stores, as digital data of the pixel signal, a count value indicated by a count signal being output from the counter circuit 54 at a timing when a pulse is output from the pulse generator 46 on a corresponding column. This count value corresponds to the length of a period from the start of comparison of a pixel signal with the reference signal to a change of the level of the output signal. In such a way, it is possible to digitally convert an analog signal output from the pixel 12 into a digital signal.

The horizontal scanning circuit 60 supplies control signals to the memories 52 on respective column of the memory unit 50 sequentially on a column basis. The memory 52 on a column that receives a control signal from the horizontal scanning circuit 60 outputs a held pixel signal to the horizontal output line 56. The output circuit 70 performs predetermined signal processing on a pixel signal output from the memory unit 50 and outputs the pixel signal to the external of the photoelectric conversion device 100.

Figure 3:
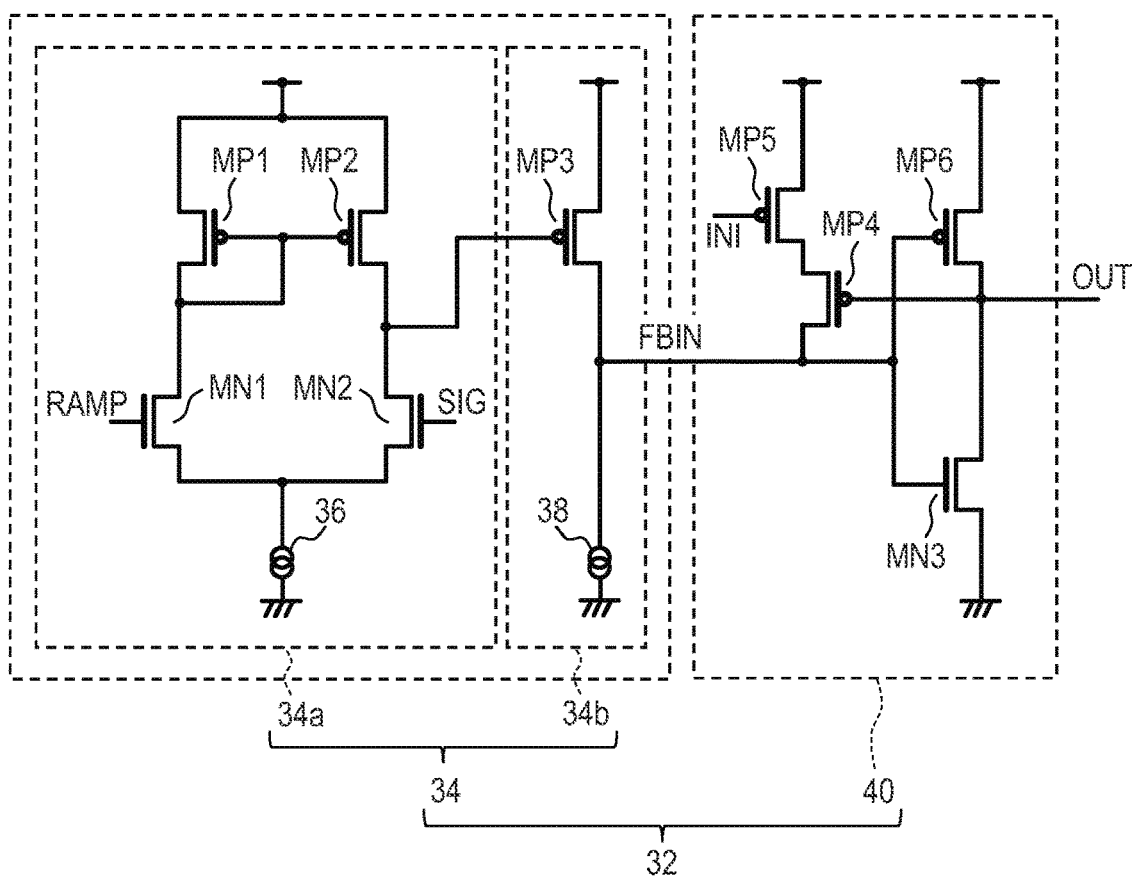
FIG. 3 is a circuit diagram illustrating a configuration example of a comparator in the photoelectric conversion device according to the first embodiment of the present invention.

Next, the configuration example of the comparator 32 in the photoelectric conversion device according to the present embodiment will be described with reference to FIG. 3 to FIG. 4C. FIG. 3 is a circuit diagram illustrating a configuration example of the comparator in the photoelectric conversion device according to the present embodiment. FIG. 4A to FIG. 4C are circuit diagrams illustrating configuration examples of a load element in an amplifier unit of the comparison circuit.

The comparator 32 is formed including the comparison circuit 34 and the positive feedback circuit 40, as described above. Although the comparator 32 and the pulse generator 46 are described as separate components in the present embodiment, the pulse generator 46 may be configured as a part of the comparator 32.

The comparison circuit 34 may be formed of p-channel transistors MP1, MP2, and MP3, n-channel transistors MN1 and MN2, a tail current source 36, and a current source 38, as illustrated in FIG. 3, for example. Out of these components, the p-channel transistors MP1 and MP2, the n-channel transistors MN1 and MN2, and the tail current source 36 form a differential unit 34a, and the p-channel transistor MP3 and the current source 38 form an amplifier unit 34b.

The source of the p-channel transistor MP1, the source of the p-channel transistor MP2, and the source of the p-channel transistor MP3 are connected to the power supply voltage node. The drain of the p-channel transistor MP1 is connected to the drain of the n-channel transistor MN1. The drain of the p-channel transistor MP2 is connected to the drain of the n-channel transistor MN2. The gate of the p-channel transistor MP1 and the gate of the p-channel transistor MP2 are connected to the connection node between the drain of the p-channel transistor MP1 and the drain of the n-channel transistor MN1. The tail current source 36 is connected between each source of the n-channel transistor MN1 and the n-channel transistor MN2 and the reference voltage node (for example, a ground node). The connection node between the drain of the p-channel transistor MP2 and the drain of the n-channel transistor MN2 is connected to the gate of the p-channel transistor MP3. That is, the connection node between the drain of the p-channel transistor MP2 and the drain of the n-channel transistor MN2 is the output node of the differential unit 34a, and the gate of the p-channel transistor MP3 is the input node of the amplifier unit 34b. The current source 38 is connected between the drain of the p-channel transistor MP3 and the reference voltage node.

Accordingly, the n-channel transistor MN1 and the n-channel transistor MN2 form a differential pair, and the p-channel transistor MP1 and the p-channel transistor MP2 form a current mirror. The gate of the n-channel transistor MN2 is the non-inverting input terminal of the comparison circuit 34 to which the signal SIG of the output line 16 is supplied. The gate of the n-channel transistor MN1 is the inverting input terminal of the comparison circuit 34 to which a reference signal RAMP is supplied from the reference signal line 48a. The connection node between the drain of the p-channel transistor MP3 and the current source 38 is the output node (node FBIN) of the comparison circuit 34.

Figure 4A:
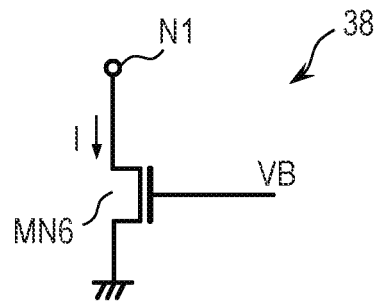
FIG. 4A, FIG. 4B and FIG. 4C are circuit diagrams illustrating configuration examples of a load element in an amplifier unit of the comparison circuit of the photoelectric conversion device according to the first embodiment of the present invention.

The current source 38 forms a load element of the amplifier unit 34b, typically, which may be formed of the n-channel transistor MN6 that forms a gate grounded circuit and whose gate is supplied with a bias voltage VB that is different from the reference voltage, as illustrated in FIG. 4A, for example. The node N1 is one of the terminals of the current source 38, which is the node connected to the drain of the p-channel transistor MP3 in the circuit of FIG. 3.

Figure 4B:
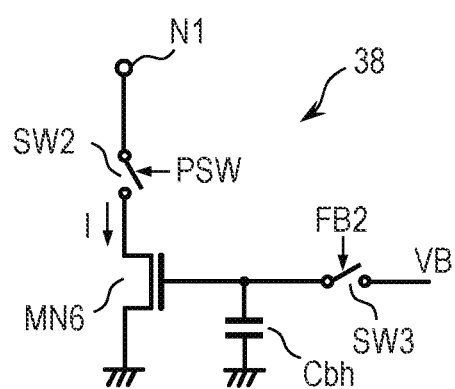

Alternatively, the current source 38 may also be formed of a circuit including the n-channel transistor MN6, a bias hold capacitor Cbh, and switches SW2 and SW3, as illustrated in FIG. 4B, for example. The switch SW2 is connected between the n-channel transistor MN6 and the node N1. The source of the n-channel transistor MN6 is connected to the reference voltage node. The gate of the n-channel transistor is connected to one of the electrodes of the bias hold capacitor Cbh. The other electrode of the bias hold capacitor Cbh is connected to the reference voltage node. Further, the bias voltage VB is supplied to the gate of the n-channel transistor MN6 via the switch SW3. The switch SW2 is a switch whose connection state (conduction or non-conduction) is controlled by a control signal PSW. The switch SW2 is a switch used for power saving. Further, the switch SW3 is a switch whose connection state (conduction or non-conduction) is controlled by a control signal FB2.

The bias voltage VB used for causing predetermined current I to flow in the n-channel transistor MN6 is supplied to the gate of the n-channel transistor MN6 via the switch SW3. By once turning on and then turning off the switch SW3, it is possible to hold the bias voltage VB in the bias hold capacitor Cbh. With such a configuration, even if the reference voltage GND fluctuates, it is possible to maintain the gate-source voltage Vgs of the n-channel transistor MN6 at a constant voltage and suppress the current I from fluctuating. Further, by turning off the switch SW2, it is possible to reduce power consumption when not used.

Figure 4C:
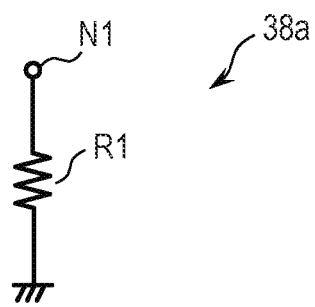

Alternatively, as the load element 38a of the amplifier unit 34b, a passive load such as a resistor R1 may be used instead of an active load such as the current source 38, as illustrated in FIG. 4C, for example.

The positive feedback circuit 40 has an input node and an output node. The positive feedback circuit 40 is a circuit that changes a signal level of the output node at a rate higher than the changing rate of the signal level of the input node in response to a change in the signal level of the input node. In the following description, changing the signal level of the output node at a rate higher than the changing rate of the signal level of the input node may be expressed as "facilitating" a change of the signal level of the output node. The positive feedback circuit 40 may be formed of the p-channel transistor MP4, MP5, and MP6 and the n-channel transistor MN3 as illustrated in FIG. 3, for example.

The source of the p-channel transistor MP5 and the source of the p-channel transistor MP6 are connected to the power supply voltage node. The drain of the p-channel transistor MP5 is connected to the source of the p-channel transistor MP4. The drain of the p-channel transistor MP6 is connected to the drain of the n-channel transistor MN3. The drain of the p-channel transistor MP4 is connected to the gate of the p-channel transistor MP6 and the gate of the n-channel transistor MN3. The source of the n-channel transistor MN3 is connected to the reference voltage node. The gate of the p-channel transistor MP4 is connected to the connection node between the drain of the p-channel transistor MP6 and the drain of the n-channel transistor MN3.

The connection node (node FBIN) of the drain of the p-channel transistor MP4, the gate of the p-channel transistor MP6, and the gate of the n-channel transistor MN3 is the input node of the positive feedback circuit 40. The input node of the positive feedback circuit 40 is connected to the connection node of the p-channel transistor MP3 to the current source 38, that is, the output node of the comparison circuit 34. The connection node of the gate of the p-channel transistor MP4, the drain of the p-channel transistor MP6, and the drain of the n-channel transistor MN3 is the output node (node OUT) of the positive feedback circuit 40. The p-channel transistor MP5 is controlled by a control signal INI supplied from the control circuit 80.

Note that the source and the drain of a transistor may be called opposite names in accordance with the conductivity type thereof, a function of interest, or the like. In this specification, the source and the drain may be denoted as a main node without distinction, and the gate may be denoted as a control node.

Figure 5:
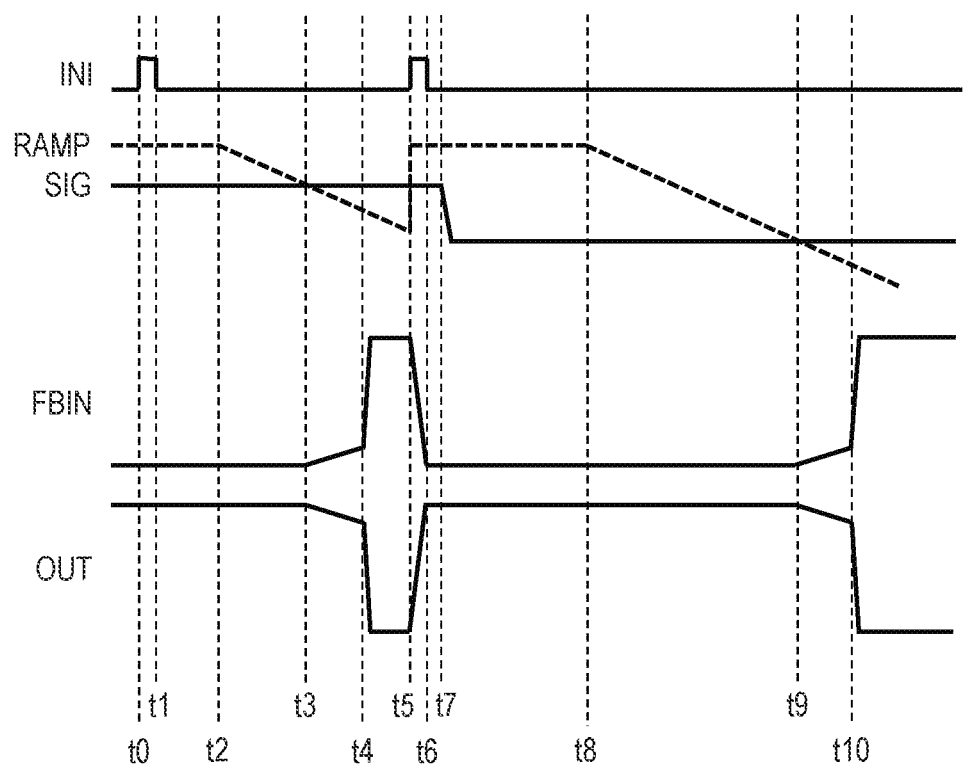
FIG. 5 is a timing diagram illustrating the operation of the comparator in the photoelectric conversion device according to the first embodiment of the present invention.

Next, the operation of the comparator 32 in the photoelectric conversion device according to the present embodiment will be described with reference to FIG. 5. FIG. 5 is a timing diagram illustrating the operation of the comparator in the photoelectric conversion device according to the present embodiment. FIG. 5 illustrates the control signal INI, the reference signal RAMP, the signal SIG of the output line 16, the potential of the node FBIN, and the potential of the node OUT.

At time t0, a signal (noise signal) in accordance with the reset level of the pixel 12 is being output as the signal SIG to the output line 16. Further, the reference level of the reference signal RAMP whose change in the potential level has not yet been started is higher than the level of the signal SIG in accordance with the reset level of the pixel 12. That is, in the present embodiment, the reference signal RAMP whose potential level gradually decreases with time is used.

First, in the period from time t0 to time t1, the control circuit 80 controls the control signal INI from the L level to the H level. Thereby, the p-channel transistor MP5 is turned off. Further, in the same period from time t0 to time t1, the level of the reference signal RAMP is in a state of being higher than the level of the signal SIG, the gate potential of the p-channel transistor MP3 is a level close to the power supply voltage, and the p-channel transistor MP3 is in an off-state.

Accordingly, the potential of the node FBIN, which is the output node of the comparison circuit 34 and is also the input node of the positive feedback circuit 40, decreases to a potential close to the reference voltage (GND) due to current caused to flow by the current source 38. The potential of the node FBIN then decreases to the reference voltage, thereby the p-channel transistor MP6 is turned on, the n-channel transistor MN3 is turned off, and the potential of the node OUT, which is the output node of the positive feedback circuit 40, is at the H level close to the power supply voltage. Further, in response to the node OUT being at the H level, the p-channel transistor MP4 whose gate receives the potential of the node OUT is turned off. Further, in response to transition of the control signal INI from the H level to the L level at time t1, the p-channel transistor MP5 is turned on.

At subsequent time t2, the reference signal generation circuit 48 starts changing the potential level of the reference signal RAMP. The reference signal generation circuit 48 outputs the reference signal RAMP having a ramp waveform whose potential gradually decreases with time, for example. Further, the counter circuit 54 starts count in synchronization with the start the change in the potential level of the reference signal RAMP and outputs a count signal indicating a count value to the count signal line 54a.

At subsequent time t3, it is assumed that the level of the reference signal RAMP decreases below the level of the signal SIG in accordance with the reset level of the pixel 12. In response, the gate potential of the p-channel transistor MP3 starts decreasing gradually from time t3, and thereby the potential of the node FBIN starts increasing gradually. Further, the potential of the gate of the p-channel transistor MP6 and the gate of the n-channel transistor MN3 connected to the node FBIN starts increasing gradually, and thereby the potential of the node OUT starts decreasing gradually.

Accordingly, at subsequent time t4, the p-channel transistor MP4 is turned on. In response, the node FBIN and the power supply voltage node are connected to each other, thereby positive feedback is applied to the potential of the node FBIN, and the potential of the node FBIN increases rapidly. As a result, the potential of the node OUT decreases rapidly.

In response to the rapid change in the potential of the node OUT, the pulse generator 46 generates and outputs one shot of pulse to the memory 52. The memory 52 holds a count value, which is indicated by a count signal being output from the counter circuit 54 at the timing of receiving the pulse from the pulse generator 46, as digital data of the signal SIG in accordance with the reset level of the pixel 12, that is, digital data of a noise signal.

At subsequent time t5, the reference signal generation circuit 48 resets the potential level of the reference signal RAMP to the reference level. Accordingly, the level of the reference signal RAMP returns to the state of being higher than the level of the signal SIG, the potential of the gate of the p-channel transistor MP3 reaches a level close to the power supply voltage, and the p-channel transistor MP3 is turned off. Further, in the period from time t5 to time t6, the control circuit 80 controls the control signal INI from the L level to the H level. Thereby, the p-channel transistor MP5 is turned off.

Accordingly, the potential of the node FBIN, which is the output node of the comparison circuit 34 and is also the input node of the positive feedback circuit 40, decreases to a potential close to the reference voltage due to current caused to flow by the current source 38. The potential of the node FBIN then decreases to the reference voltage, thereby the p-channel transistor MP6 is turned on, the n-channel transistor MN3 is turned off, and the potential of the node OUT, which is the output node of the positive feedback circuit 40, reaches the H level close to the power supply voltage. Further, in response to the node OUT reaching the H level, the p-channel transistor MP4 whose gate receives the potential of the node OUT is turned off. Further, in response to transition of the control signal INI from the H level to the L level at time t6, the p-channel transistor MP5 is turned on.

At subsequent time t7, signal charge of the pixel 12 to be read out is transferred to the floating diffusion portion FD, thereby a signal (light detection signal) in accordance with the amount of signal charge as the signal SIG is output, and the level of the signal SIG of the output line 16 is reduced.

At subsequent time t8, the reference signal generation circuit 48 starts changing the potential level of the reference signal RAMP. Further, the counter circuit 54 newly starts count in synchronization with the start of the change in the potential level of the reference signal RAMP and outputs a count signal indicating a count value to the count signal line 54a.

At subsequent time t9, it is assumed that the level of the reference signal RAMP decreases below the level of the signal SIG in accordance with the amount of signal charge. In response, the gate potential of the p-channel transistor MP3 starts decreasing gradually from time t9, and thereby the potential of the node FBIN starts increasing gradually. Further, the potential of the gate of the p-channel transistor MP6 and the gate of the n-channel transistor MN3 connected to the node FBIN starts increasing gradually, and thereby the potential of the node OUT starts decreasing gradually.

Accordingly, at subsequent time t10, the p-channel transistor MP4 is turned on. In response, the node FBIN and the power supply voltage node are connected to each other, thereby positive feedback is applied to the potential of the node FBIN, and the potential of the node FBIN increases rapidly. As a result, the potential of the node OUT decreases rapidly.

In response to the rapid change in the potential of the node OUT, the pulse generator 46 generates and outputs one shot of pulse to the memory 52. The memory 52 holds a count value, which is indicated by a count signal being output from the counter circuit 54 at the timing of receiving the pulse from the pulse generator 46, as digital data of the signal SIG in accordance with the amount of signal charge, that is, digital data of a light detection signal.

The digital data of the noise signal and the digital data of the light detection signal held in the memory 52 in such a way are transferred to the output circuit 70 in accordance with a control signal from the horizontal scanning circuit 60. In the output circuit 70, the difference between a digital value of the noise signal and a digital value of the light detection signal is calculated by using a so-called digital CDS process and output to the external of the photoelectric conversion device 100 as a final AD conversion result.

In the comparator 32 of the present embodiment, with the application of the amplifier unit using the current source 38 in the output stage of the comparison circuit 34, it is possible to suppress a malfunction of the comparator 32. This feature will be described below.

It may be considered that, instead of the current source 38, a switch transistor to reset the potential of the node FBIN is provided to a portion in which the current source 38 is provided in the circuit illustrated in FIG. 3 (for example, see International Publication No. WO2018/037901). When such a switch transistor is controlled by the control signal INI, the node FBIN is at the L level and in a floating state during a period from the time the control signal INI becomes the L level to the time the reference signal RAMP starts changing its potential. This period corresponds to the period from time t1 to time t2 and the period from time t6 to time t8 in the timing diagram of FIG. 5.

During these periods, the switch transistor and the p-channel transistors MP3, MP4, and MP5 are in the off-state. In this state, since off-leak current flowing when a transistor is in an off-state varies significantly, the potential of the node FBIN may undesirably start rising before the potential of the reference signal RAMP starts changing for a particular off-leak current of each transistor. In particular, such a phenomenon may occur in a comparator in which the sum of off-leak current flowing in the path of the p-channel transistors MP4 and MP5 and off-leak current flowing in the p-channel transistor MP3 is larger than the off-leak current of the switch transistor. As a result, if positive feedback is applied on the input signal and the potential of the node OUT is inverted before the potential of the reference signal RAMP starts changing, the memory 52 is unable to take in a count value in a period in which the potential of the reference signal RAMP changes (AD conversion period). In more detail, the memory 52 undesirably takes in the count initial value occurring before the start of count, and this will cause a large AD conversion error.

In this regard, in the comparator 32 of the present embodiment, since an amplifier unit using the current source 38 is applied on the output stage of the comparison circuit 34 and thereby a current path is provided between the node FBIN and the reference voltage node, the potential of the node FBIN during this period is stabilized at a level close to the reference voltage. Accordingly, it is possible to suppress a malfunction of the comparator 32 due to variation of the off-leak current flowing in the p-channel transistors MP3, MP4, and MP5 and reduce the AD conversion error.

As a load element of the amplifier unit 34b, the current source 38 configured as illustrated in FIG. 4A and FIG. 4B is applicable, as described previously. In such a case, the bias voltage VB (gate-source voltage Vgs) supplied to the gate of the n-channel transistor MN6 is set to a value that is larger than the threshold voltage of the n-channel transistor MN6 so as not to be affected by variation of off-leak current.

Further, it is possible to suppress a malfunction of the comparator 32 not only in the case where an active load such as the current source 38 is used but also in the case where a passive load such as the resistor R1 illustrated in FIG. 4C is used. For example, it is assumed that the sum of the sub-threshold current flowing in the path of the p-channel transistors MP4 and MP5 and the sub-threshold current flowing in the p-channel transistor MP3 is 1 nA and the resistance of the resistor R1 is 1 MΩ. The potential of the node FBIN in this case is 1 mV, and therefore the n-channel transistor MN3 will not be turned on, no positive feedback will be applied to the output, and thus no malfunction will occur.

It is however preferable to use a current source load rather than a resistor as the load element of the amplifier unit 34b in terms of saving the area or in terms of suppressing interference between the positive feedback circuits 40 to reduce an AD conversion error.

When the resistor R1 illustrated in FIG. 4C is used as the load element of the amplifier unit 34b, current determined by the power supply voltage VDD and the resistance of the resistor R1 flows into the resistor R1 during a period in which the node FBIN is at the H level (for example, the period from time t4 to time t5 of FIG. 5). Thus, to suppress the current value flowing in the resistor R1 to 10 μA when the power supply voltage VDD is 1 V or 3 V, for example, the resistor R1 is required to have a large resistance such as 100 kΩ or 300 kΩ, and this is unfavorable in terms of saving the area.

Further, when the resistor R1 having a small resistance is used because a sufficient area is unable to be secured for the resistor R1 or the like, the current fluctuation on and after time t4 is larger, and there is a concern about an increase in the AD conversion error due to interference between positive feedback circuits. Although four comparison circuits 34 and four positive feedback circuits 40 are illustrated as a column circuit for four columns in FIG. 1, several hundreds to several thousands of column circuits are typically provided in the actual implementation. Thus, a significantly large current fluctuation may occur in the overall photoelectric conversion device due to the current fluctuation on and after time t4. At this time, since a finite impedance is attached to the power supply voltage node or the reference voltage node, a current fluctuation may cause a large potential fluctuation to occur in the power supply voltage VDD or the reference voltage GND. Accordingly, there will be a difference in the inversion timing in accordance with the number of positive feedback circuits 40 inverted at the same time, and a large error may occur in an AD conversion result. In other words, the error of AD conversion may be significantly increased because of the interference due to inversion operations of other positive feedback circuits 40.

Further, in addition to a current fluctuation caused by the p-channel transistor MP4 being turned on, through-current flowing in the p-channel transistor MP6 and the n-channel transistor MN3 when the output signal of the positive feedback circuit 40 is inverted causes a potential fluctuation of the power supply voltage VDD or the reference voltage GND. The configuration of the current source 38 illustrated in FIG. 4B is particularly preferable in terms of suppressing a current fluctuation due to potential fluctuations of the power supply voltage VDD or the reference voltage GND. With such a configuration of the current source 38, even if the reference voltage GND fluctuates due to an inversion operation of the positive feedback circuit 40, the gate-source voltage Vgs of the n-channel transistor MN6 can be maintained at constant, and a fluctuation of the current I can be suppressed. Further, because the switch SW2 is turned off, power consumption during not in use can be reduced. The circuit configuration of FIG. 4C is applicable not only to the current source 38 but also to the current source 18, the tail current source 36, and the current sources 42 and 44 illustrated in the embodiments described later.

The circuit configuration of the comparator 32 illustrated in FIG. 3 also has an effect of reducing the impedance of the node FBIN, and thus has an advantageous effect of suppressing a malfunction of the comparator 32 and thus reducing the AD conversion error.

In the configuration in which a switch transistor is provided instead of the current source 38 as described previously, the node FBIN is at the L level and in a floating state during a period in which the control signal INI is at the L level (time t1 to time t5 and on and after time t6). Since a floating state is a high impedance state, the potential of the node FBIN will easily fluctuate when a potential fluctuation of the power supply voltage VDD or the reference voltage GND as described previously occurs. Thus, interference due to inversion operations of other positive feedback circuits 40 may significantly increase the AD conversion error. Further, for some cases, when the node FBIN fluctuates, the transistor MP4 is temporarily turned on and positive feedback is applied to the input, and a malfunction may occur.

In this regard, in the circuit configuration of the comparator 32 illustrated in FIG. 3, since the current source 38 or the resistor R1 is provided as the load of the amplifier unit 34b, this can prevent the node FBIN from being in the high impedance state. Accordingly, it is possible to suppress the potential fluctuation of the node FBIN and reduce the AD conversion error.

Note that, in terms of reducing the impedance of the node FBIN, the bias voltage VB in FIG. 4A and FIG. 4B is not necessarily required to be greater than or equal to the threshold voltage and may be a voltage between the reference voltage and the threshold voltage. Also in such a case, the advantageous effect of reducing the AD conversion error caused by reducing the impedance of the node FBIN can be obtained. Further, an advantageous effect of reducing power consumption caused by suppressing the current I flowing the current source 38 can be expected. In terms of more reducing the AD conversion error, however, it is desirable to set the bias voltage VB to be greater than or equal to the threshold voltage, as described previously.

As described above, according to the present embodiment, it is possible to suppress a malfunction of the comparator 32 due to variation of off-leak current of transistors.

It is therefore possible to reduce the AD conversion error by using such a comparator to form an AD conversion circuit. Further, it is possible to acquire a high quality image with a smaller AD conversion error by using such an AD conversion circuit to form a photoelectric conversion device.

Second Embodiment

Figure 6:
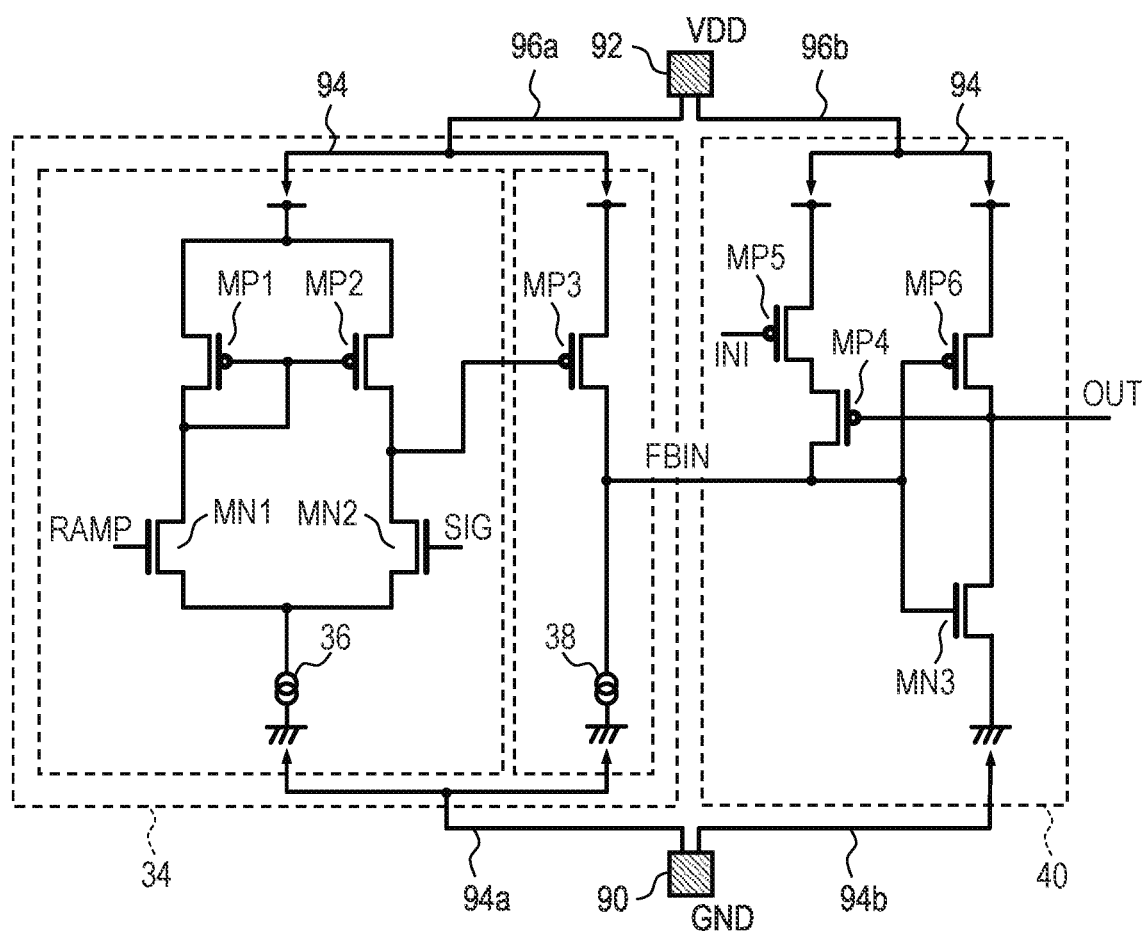
FIG. 6 is a circuit diagram illustrating a configuration example of a comparator in a photoelectric conversion device according to a second embodiment of the present invention (Part 1).
Figure 7:
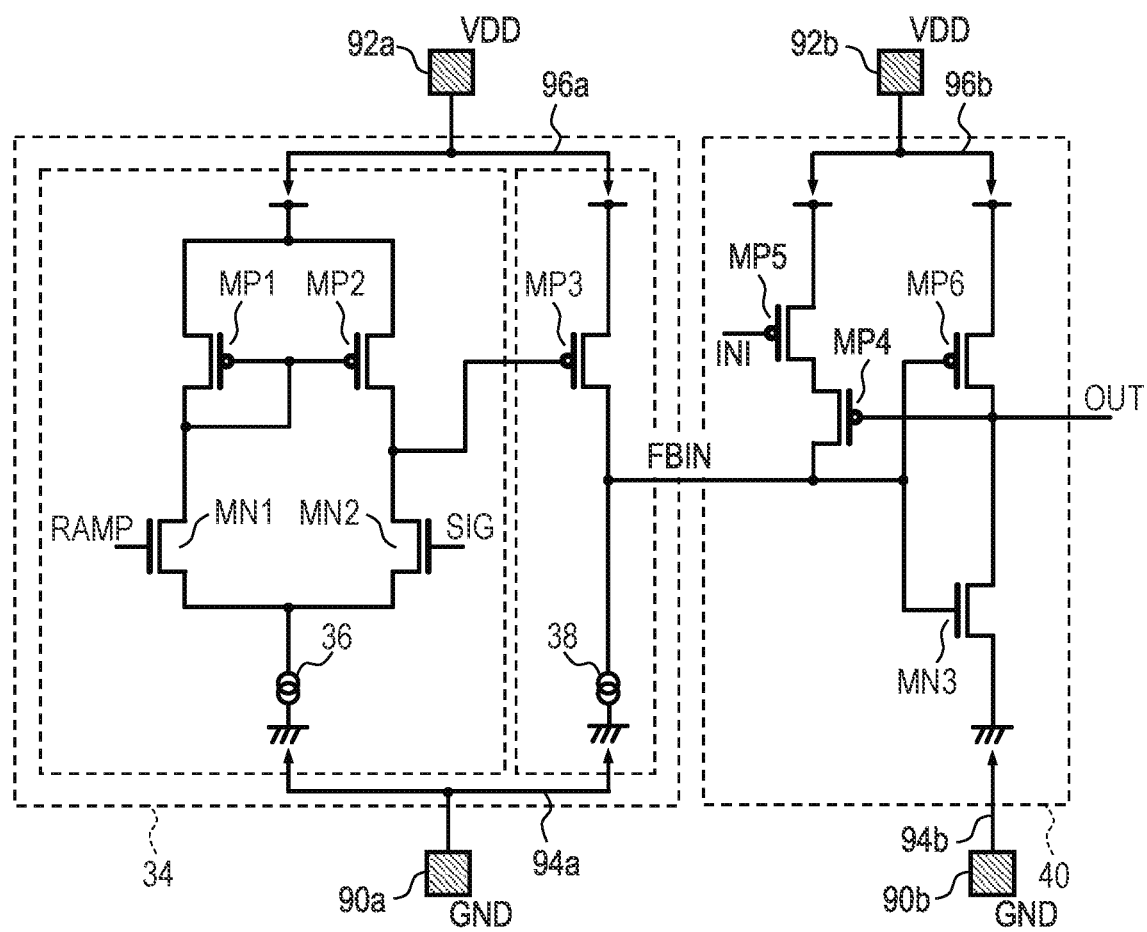
FIG. 7 is a circuit diagram illustrating a configuration example of a comparator in the photoelectric conversion device according to the second embodiment of the present invention (Part 2).

A photoelectric conversion device according to a second embodiment of the present invention will be described with reference to FIG. 6 and FIG. 7. The same components as those of the photoelectric conversion device according to the first embodiment are labeled with the same references, and the description thereof will be omitted or simplified. FIG. 6 and FIG. 7 are circuit diagrams illustrating configuration examples of a comparator in the photoelectric conversion device according to the present embodiment.

In the present embodiment, an example interconnection arrangement to a reference voltage pad connected to the comparator 32 will be described. Although description will be provided here with the circuit configuration of the first embodiment, the same can apply to the circuit configuration of other embodiments described later.

In FIG. 6 and FIG. 7, a reference voltage pad 90 (GND pad) is a pad electrode connected to the reference voltage node. A power supply voltage pad 92 (VDD pad) is a pad electrode connected to the power supply voltage node. The pad electrodes are electrodes used for connecting interconnections outside the photoelectric conversion device 100 to the photoelectric conversion device 100.

In the configuration example illustrated in FIG. 6, the reference voltage node arranged in the comparison circuit 34 and the reference node arranged in the positive feedback circuit 40 are connected to the reference voltage pad 90 via separate interconnections 94a and 94b, respectively. Further, the power supply voltage node arranged in the comparison circuit 34 and the power supply voltage node arranged in the positive feedback circuit 40 are connected to the power supply voltage pad 92 via separate interconnections 96a and 96b, respectively. With such a configuration, it is possible to suppress influence on the comparison circuit 34 caused by a fluctuation of the power supply voltage VDD or the reference voltage GND due to an inversion operation in the positive feedback circuit 40 and further reduce the AD conversion error.

In the configuration example illustrated in FIG. 7, furthermore, the reference voltage node arranged in the comparison circuit 34 and the reference node arranged in the positive feedback circuit 40 are connected to separate reference voltage pads 90a and 90b via the separate interconnections 94a and 94b, respectively. Further, the power supply voltage node arranged in the comparison circuit 34 and the power supply voltage node arranged in the positive feedback circuit 40 are connected to separate power supply voltage pads 92a and 92b via the separate interconnections 96a and 96b, respectively. With such a configuration, it is possible to suppress influence on the comparison circuit 34 caused by a fluctuation of the power supply voltage VDD or the reference voltage GND due to an inversion operation in the positive feedback circuit 40 and further reduce the AD conversion error.

In the configuration example of FIG. 7, since the power supply voltage pads 92a and 92b are separated, it is possible to differentiate the power supply voltage supplied to the power supply voltage node arranged in the comparison circuit 34 and the power supply voltage supplied to the positive feedback circuit 40 from each other. For example, the power supply voltage supplied to the positive feedback circuit 40 can be set to be equal to or higher than the power supply voltage supplied to the positive feedback circuit 40.

Note that, although both the source of the p-channel transistor MP5 and the source of the p-channel transistor MP6 are separated from the power supply voltage pad 92a and the interconnection 96a in the configuration example of FIG. 7, any one of the source of the p-channel transistor MP5 and the source of the p-channel transistor MP6 may be separated from the power supply voltage pad 92a and the interconnection 96a. Also in the case of such a configuration, it is possible to suppress influence on the comparison circuit 34 caused by a fluctuation of the power supply voltage VDD or the reference voltage GND due to an inversion operation in the positive feedback circuit 40, though the effect is reduced compared to the configuration example of FIG. 7.

As described above, according to the present embodiment, it is possible to suppress influence on the comparison circuit 34 caused by a fluctuation of the power supply voltage VDD or the reference voltage GND due to an inversion operation in the positive feedback circuit 40 and further reduce the AD conversion error. Further, it is possible to suppress a malfunction of the comparator 32 due to variation of off-leak current of transistors in the same manner as in the first embodiment. It is therefore possible to reduce the AD conversion error by using such a comparator to form an AD conversion circuit. Further, it is possible to acquire a high quality image with a smaller AD conversion error by using such an AD conversion circuit to form a photoelectric conversion device.

Third Embodiment

A photoelectric conversion device according to a third embodiment of the present invention will be described with reference to FIG. 8 to FIG. 11. The same components as those of the photoelectric conversion device according to the first and second embodiments are labeled with the same references, and the description thereof will be omitted or simplified.

Although the configuration as the comparator 32 in which the signal SIG is input to the non-inverting input terminal of the comparison circuit 34 and the reference signal RAMP is input to the inverting input terminal of the comparison circuit 34 has been described in the previous embodiments, the configuration of the comparator 32 is not limited thereto. In the present embodiment, an example of a configuration in which the signal SIG is input to the inverting input terminal of the comparison circuit 34 and the reference signal RAMP is input to the non-inverting input terminal of the comparison circuit 34 will be described as a photoelectric conversion device including the comparator 32 having another configuration.

Figure 8:
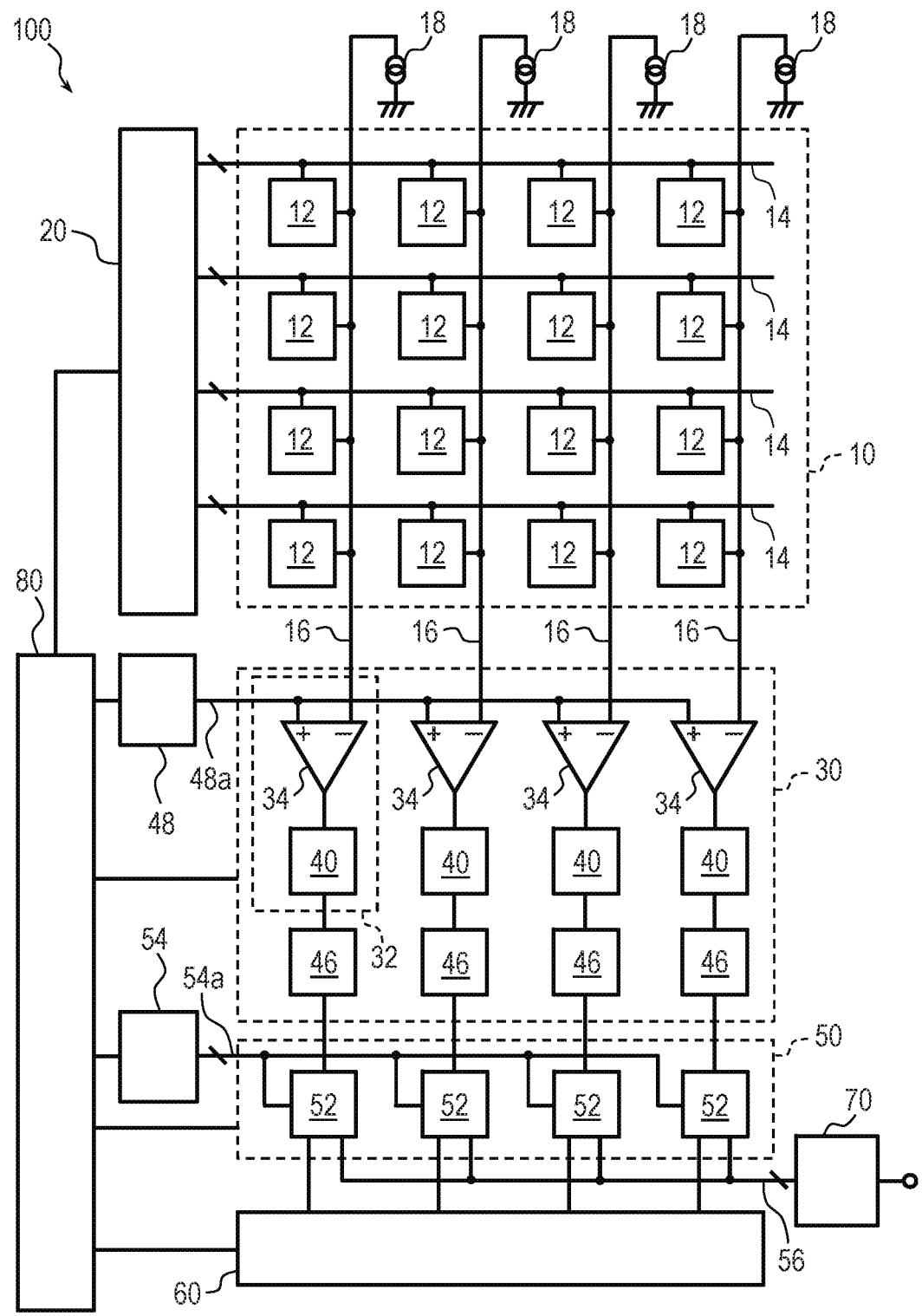
FIG. 8 is a block diagram illustrating a general configuration of a photoelectric conversion device according to a third embodiment of the present invention.

FIG. 8 is a block diagram illustrating a general configuration of the photoelectric conversion device according to the present embodiment. The general configuration of the photoelectric conversion device 100 according to the present embodiment is the same as that of the previous embodiments except that the output line 16 is connected to the inverting input terminal of the comparison circuit 34 and the reference signal line 48a is connected to the non-inverting input terminal of the comparison circuit 34, as illustrated in FIG. 8.

Figure 9:
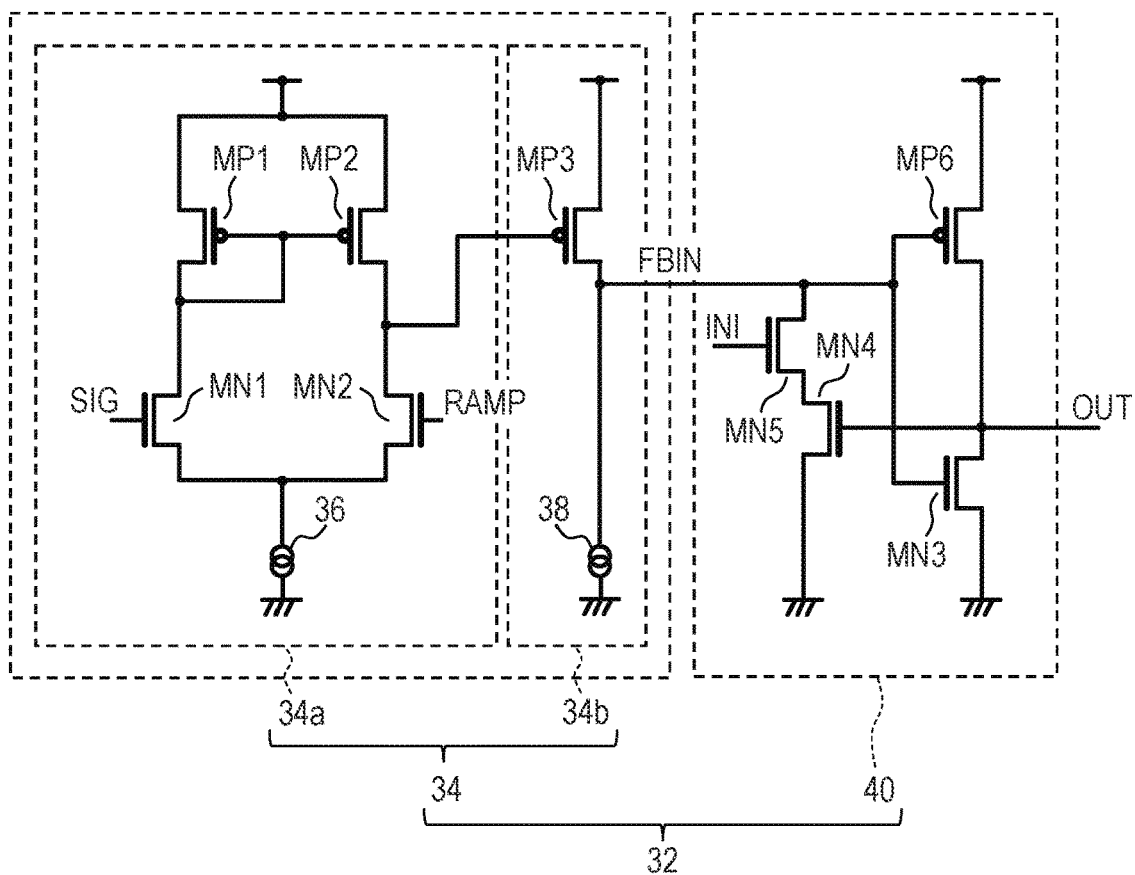
FIG. 9 is a circuit diagram illustrating a configuration example of a comparator in the photoelectric conversion device according to the third embodiment of the present invention (Part 1).

FIG. 9 is a circuit diagram illustrating a configuration example of the comparator in the photoelectric conversion device according to the present embodiment. In the comparator 32 of the present embodiment, the p-channel transistor MP4 and the p-channel transistor MP5 are replaced with the n-channel transistor MN4 and the n-channel transistor MN5 in conjunction with exchange of the input signal to the non-inverting input terminal with the input signal to the inverting input terminal. That is, the n-channel transistors MN4 and MN5 form a feedback unit of the positive feedback circuit 40.

The drain of the n-channel transistor MN5 is connected to the input node of the positive feedback circuit 40 (node FBIN). The source of the n-channel transistor MN5 is connected to the drain of the n-channel transistor MN4. The source of the n-channel transistor MN4 is connected to the reference voltage node. The gate of the n-channel transistor MN4 is connected to the connection node between the drain of the p-channel transistor MP6 and the drain of the n-channel transistor MN3. The n-channel transistor MN5 is controlled by the control signal INI supplied from the control circuit 80.

Figure 10:
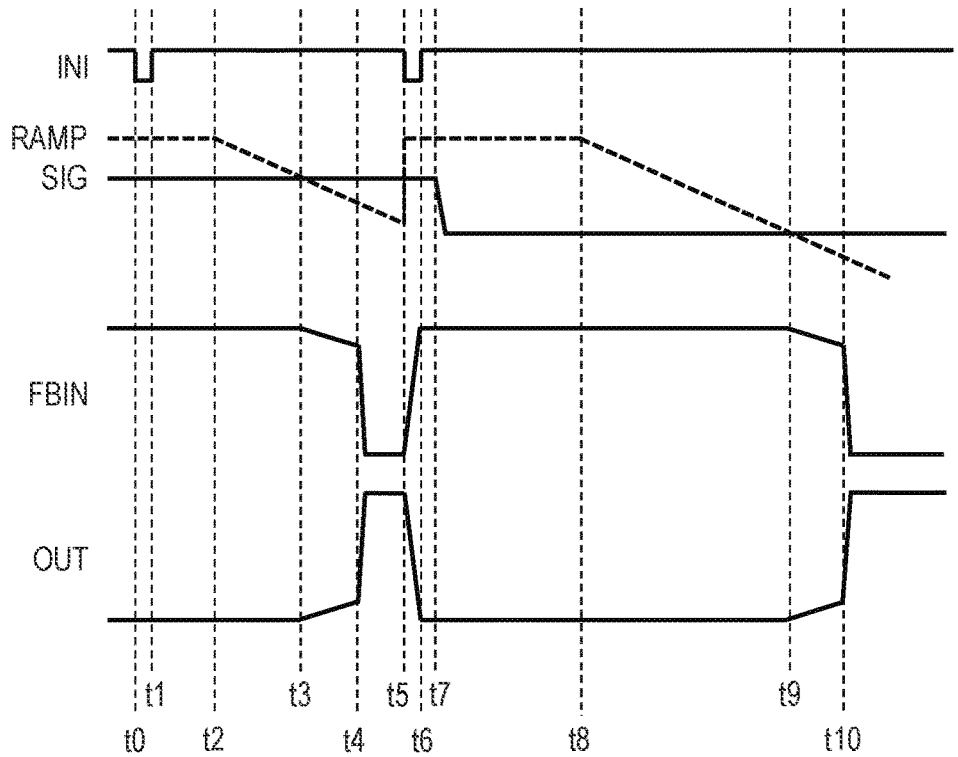
FIG. 10 is a timing diagram illustrating an operation of the comparator in the photoelectric conversion device according to the third embodiment of the present invention.

FIG. 10 is a timing diagram illustrating the operation of the comparator in the photoelectric conversion device according to the present embodiment. FIG. 10 illustrates the control signal INI, the reference signal RAMP, the signal SIG of the output line 16, the potential of the node FBIN, and the potential of the node OUT.

In the period before time t0, the control signal INI is at the H level. Further, a signal in accordance with a reset level of the pixel 12 (noise signal) has been output as the signal SIG to the output line 16. Further, the reference level of the reference signal RAMP before the change in the potential level is started is higher than the level of the signal SIG in accordance with the reset level of the pixel 12.

First, in the period from time t0 to time t1, the control circuit 80 controls the control signal INI from the H level to the L level. Thereby, the n-channel transistor MN5 is turned off. Further, in the same period from time t0 to time t1, the level of the reference signal RAMP is in a state of being higher than the level of the signal SIG, the gate potential of the p-channel transistor MP3 is a level close to the power supply voltage, and the p-channel transistor MP3 is in an off-state. Accordingly, the potential of the node FBIN, which is the output node of the comparison circuit 34 and is also the input node of the positive feedback circuit 40, is at the H level.

At subsequent time t2, the reference signal generation circuit 48 starts changing the potential level of the reference signal RAMP. The reference signal generation circuit 48 outputs the reference signal RAMP having a ramp waveform whose potential gradually decreases with time, for example. Further, the counter circuit 54 starts count in synchronization with the start of the change in the potential level of the reference signal RAMP and outputs a count signal indicating a count value to the count signal line 54a.

At subsequent time t3, it is assumed that the level of the reference signal RAMP decreases below the level of the signal SIG in accordance with the reset level of the pixel 12. In response, the gate potential of the p-channel transistor MP3 starts increasing gradually from time t3, and thereby the potential of the node FBIN starts decreasing gradually. Further, the potential of the gate of the p-channel transistor MP6 and the gate of the n-channel transistor MN3 connected to the node FBIN starts increasing gradually, and thereby the potential of the node OUT starts increasing gradually.

Accordingly, at subsequent time t4, the n-channel transistor MN4 is turned on. In response, the n-channel transistor MN4 enters the on-state, the node FBIN and the reference voltage node are connected to each other, thereby positive feedback is applied to the potential of the node FBIN, and the potential of the node FBIN decreases rapidly. As a result, the potential of the node OUT increases rapidly.

In response to the rapid change in the potential of the node OUT, the pulse generator 46 generates and outputs one shot of pulse to the memory 52. The memory 52 holds a count value, which is indicated by a count signal being output from the counter circuit 54 at the timing of receiving the pulse from the pulse generator 46, as digital data of the signal SIG in accordance with the reset level of the pixel 12, that is, digital data of a noise signal.

At subsequent time t5, the reference signal generation circuit 48 resets the potential level of the reference signal RAMP to the reference level. Thereby, the level of the reference signal RAMP returns to the state of being higher than the level of the signal SIG, the potential of the gate of the p-channel transistor MP3 reaches a level close to the power supply voltage, and the p-channel transistor MP3 is turned off. Further, in the period from time t5 to time t6, the control circuit 80 controls the control signal INI from the L level to the H level. Thereby, the n-channel transistor MN5 is turned off. Accordingly, the potential of the node FBIN, which is the output node of the comparison circuit 34 and is also the input node of the positive feedback circuit 40, reaches the H level.

At subsequent time t7, signal charge of the pixel 12 to be read out is transferred to the floating diffusion portion FD, thereby a signal in accordance with the amount of signal charge (light detection signal) is output as the signal SIG, and the level of the signal SIG of the output line 16 is reduced.

At subsequent time t8, the reference signal generation circuit 48 starts changing the potential level of the reference signal RAMP. Further, the counter circuit 54 newly starts count in synchronization with the start of the change in the potential level of the reference signal RAMP and outputs a count signal indicating a count value to the count signal line 54a.

At subsequent time t9, it is assumed that the level of the reference signal RAMP decreases below the level of the signal SIG in accordance with the amount of signal charge. In response, the gate potential of the p-channel transistor MP3 starts increasing gradually from time t9, and thereby the potential of the node FBIN starts decreasing gradually. Further, the potential of the gate of the p-channel transistor MP6 and the gate of the n-channel transistor MN3 connected to the node FBIN starts increasing gradually, and thereby the potential of the node OUT starts increasing gradually.

Accordingly, at subsequent time t10, the n-channel transistor MN4 is turned on. In response, the n-channel transistor MN4 enters the on-state, the node FBIN and the reference voltage node are connected to each other, thereby positive feedback is applied to the potential of the node FBIN, and the potential of the node FBIN decreases rapidly. As a result, the potential of the node OUT increases rapidly.

In response to the rapid change in the potential of the node OUT, the pulse generator 46 generates and outputs one shot of pulse to the memory 52. The memory 52 holds a count value, which is indicated by a count signal being output from the counter circuit 54 at the timing of receiving the pulse from the pulse generator 46, as digital data of the signal SIG in accordance with the amount of signal charge, that is, digital data of a light detection signal.

Figure 11:
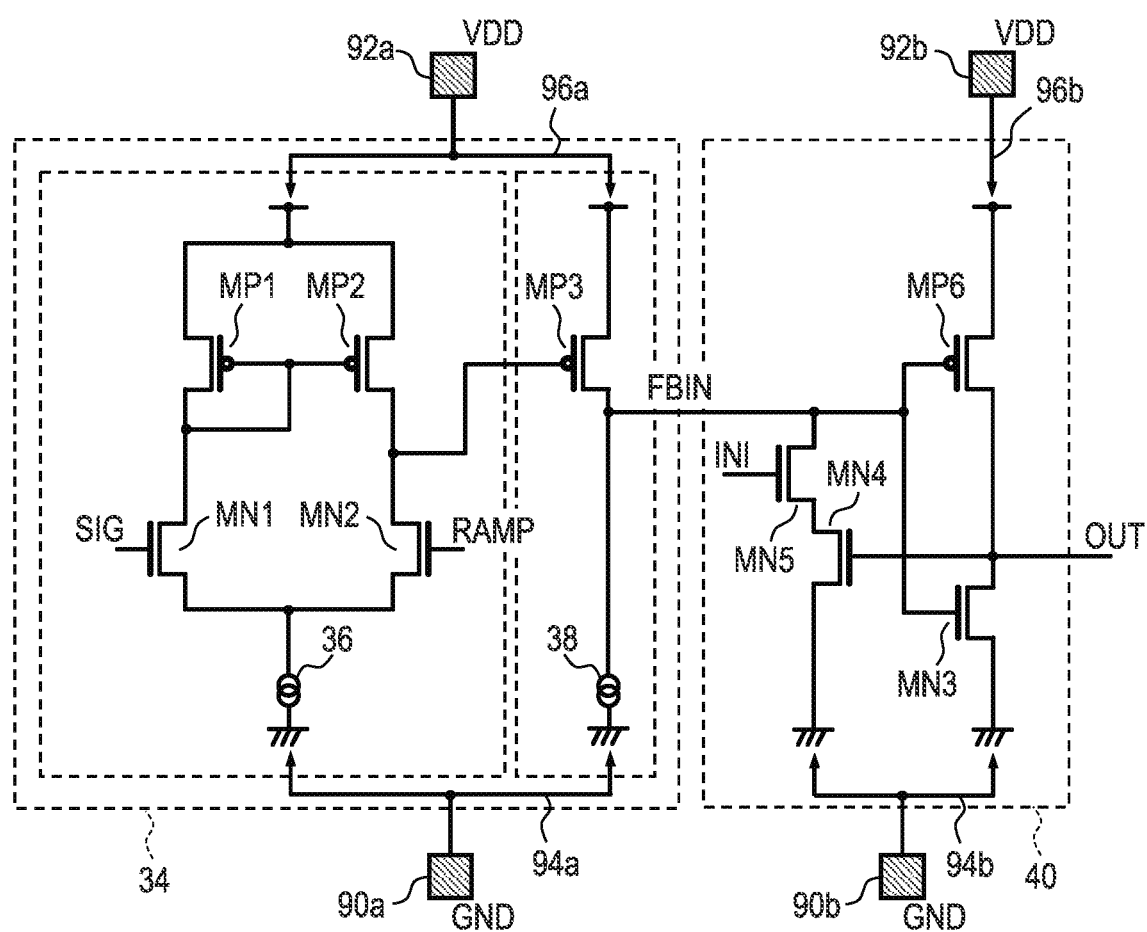
FIG. 11 is a circuit diagram illustrating a configuration example of a comparator in the photoelectric conversion device according to the third embodiment of the present invention (Part 2).

Also in the comparator 32 of the present embodiment, as illustrated in FIG. 11, the reference voltage node arranged in the comparison circuit 34 and the reference node arranged in the positive feedback circuit 40 may be connected to the separate reference voltage pads 90a and 90b via the separate interconnections 94a and 94b, respectively, in the same manner as in the second embodiment. Further, the power supply voltage node arranged in the comparison circuit 34 and the power supply voltage node arranged in the positive feedback circuit 40 may be connected to the separate power supply voltage pads 92a and 92b via the separate interconnections 96a and 96b, respectively. With such a configuration, it is possible to suppress influence on the comparison circuit 34 caused by a fluctuation of the power supply voltage VDD or the reference voltage GND due to an inversion operation in the positive feedback circuit 40 and further reduce the AD conversion error.

Note that, although both the source of the n-channel transistor MN5 and the source of the n-channel transistor MN3 are separated from the reference voltage pad 90a and the interconnection 94a in the configuration example of FIG. 11, any one of the source of the n-channel transistor MN5 and the source of the n-channel transistor MN3 may be separated from the reference voltage pad 90a and the interconnection 94a. Also in the case of such a configuration, it is possible to suppress influence on the comparison circuit 34 caused by a fluctuation of the power supply voltage VDD or the reference voltage GND due to an inversion operation in the positive feedback circuit 40, though the effect is reduced compared to the configuration example of FIG. 11.

Further, the reference voltage node arranged in the comparison circuit 34 and the reference node arranged in the positive feedback circuit 40 may be connected to the same reference voltage pad 90 via the separate interconnections 94a and 94b, respectively, in the same manner as in the configuration example illustrated in FIG. 6. Further, the power supply voltage node arranged in the comparison circuit 34 and the power supply voltage node arranged in the positive feedback circuit 40 may be connected to the same power supply voltage pad 92 via the separate interconnections 96a and 96b, respectively.

As described above, according to the present embodiment, it is possible to suppress a malfunction of the comparator 32 due to variation of off-peak current of transistors. Further, in the same manner as in the first embodiment, it is possible to suppress a malfunction of the comparator 32 due to variation of off-peak current of transistors. It is therefore possible to reduce an AD conversion error by using such a comparator to form an AD conversion circuit. Further, it is possible to acquire a high quality image with a smaller AD conversion error by using such an AD conversion circuit to form a photoelectric conversion device.

Fourth Embodiment

Figure 12:
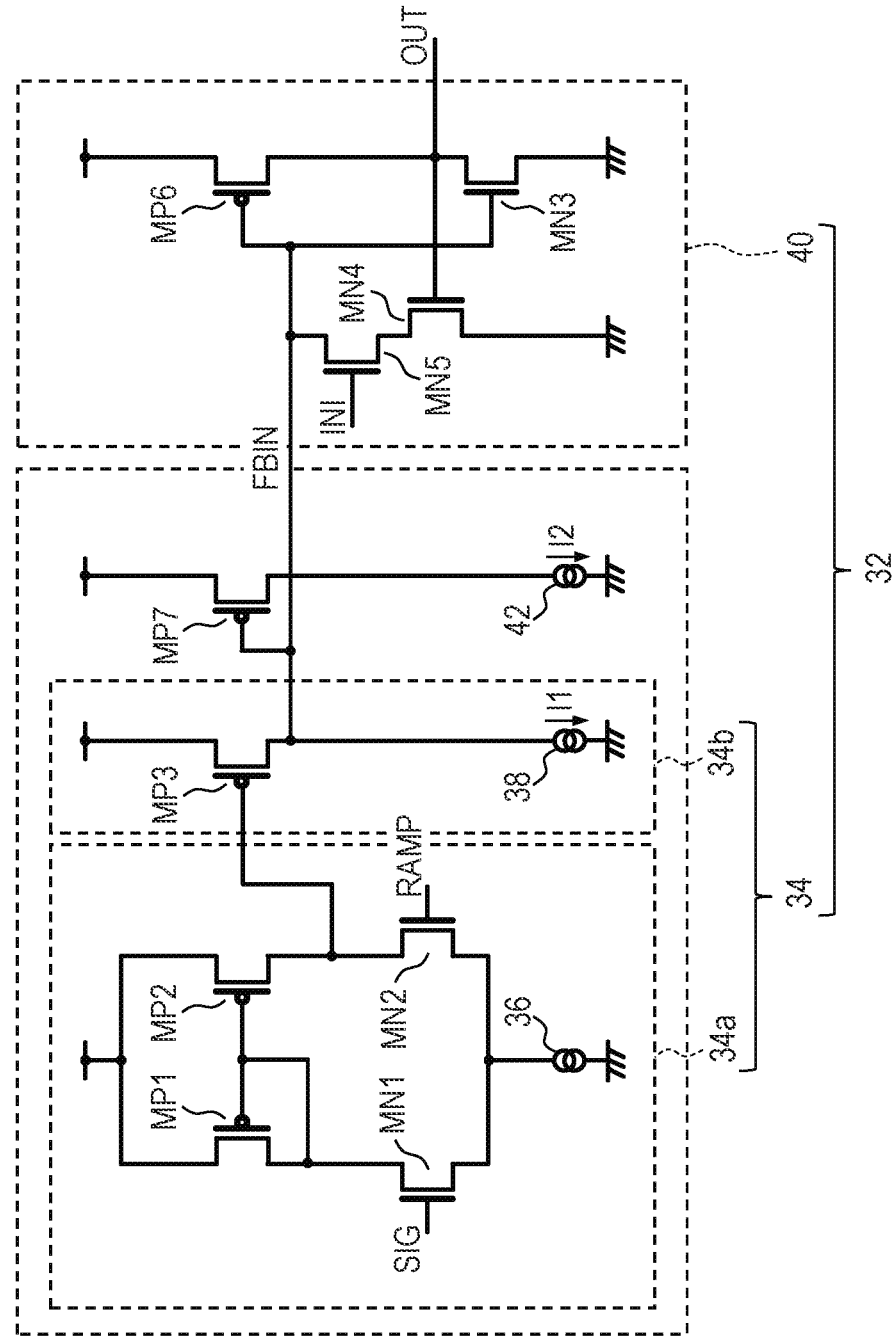
FIG. 12 is a circuit diagram illustrating a configuration example of a comparator in the photoelectric conversion device according to a fourth embodiment of the present invention (Part 1).
Figure 13:
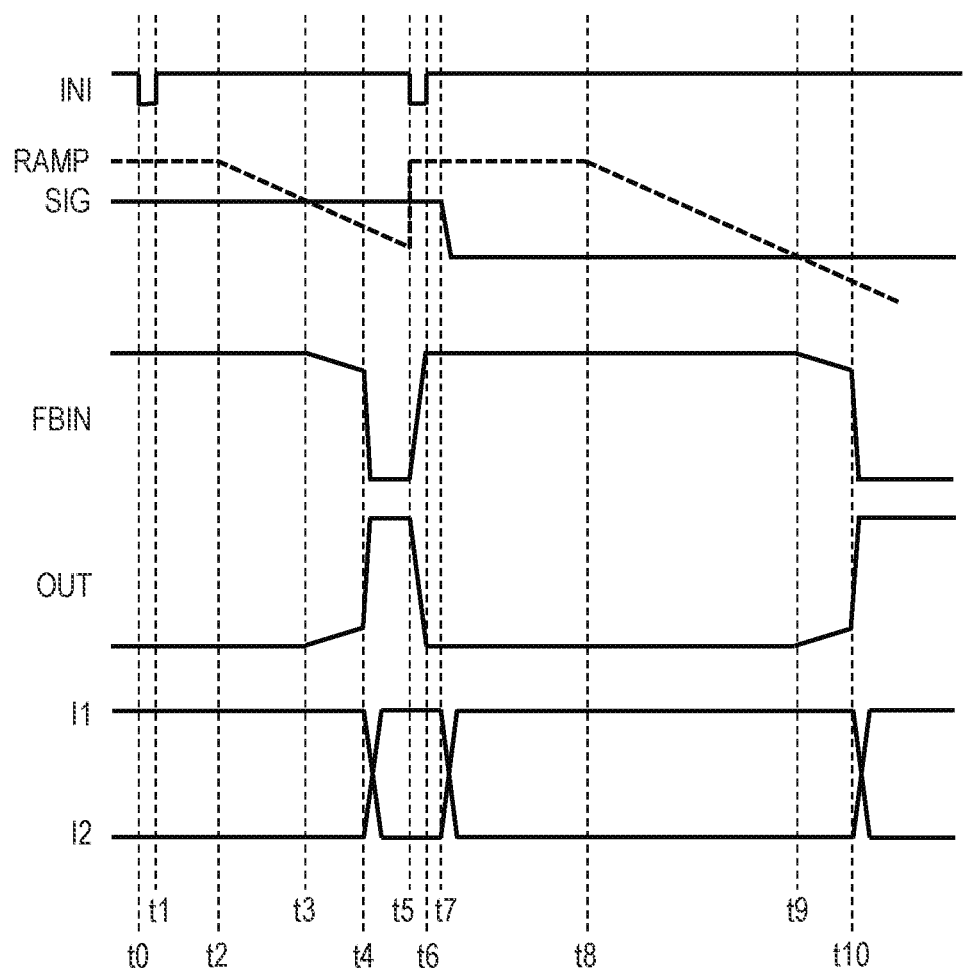
FIG. 13 is a timing diagram illustrating an operation of the comparator in the photoelectric conversion device according to the fourth embodiment of the present invention.
Figure 14:
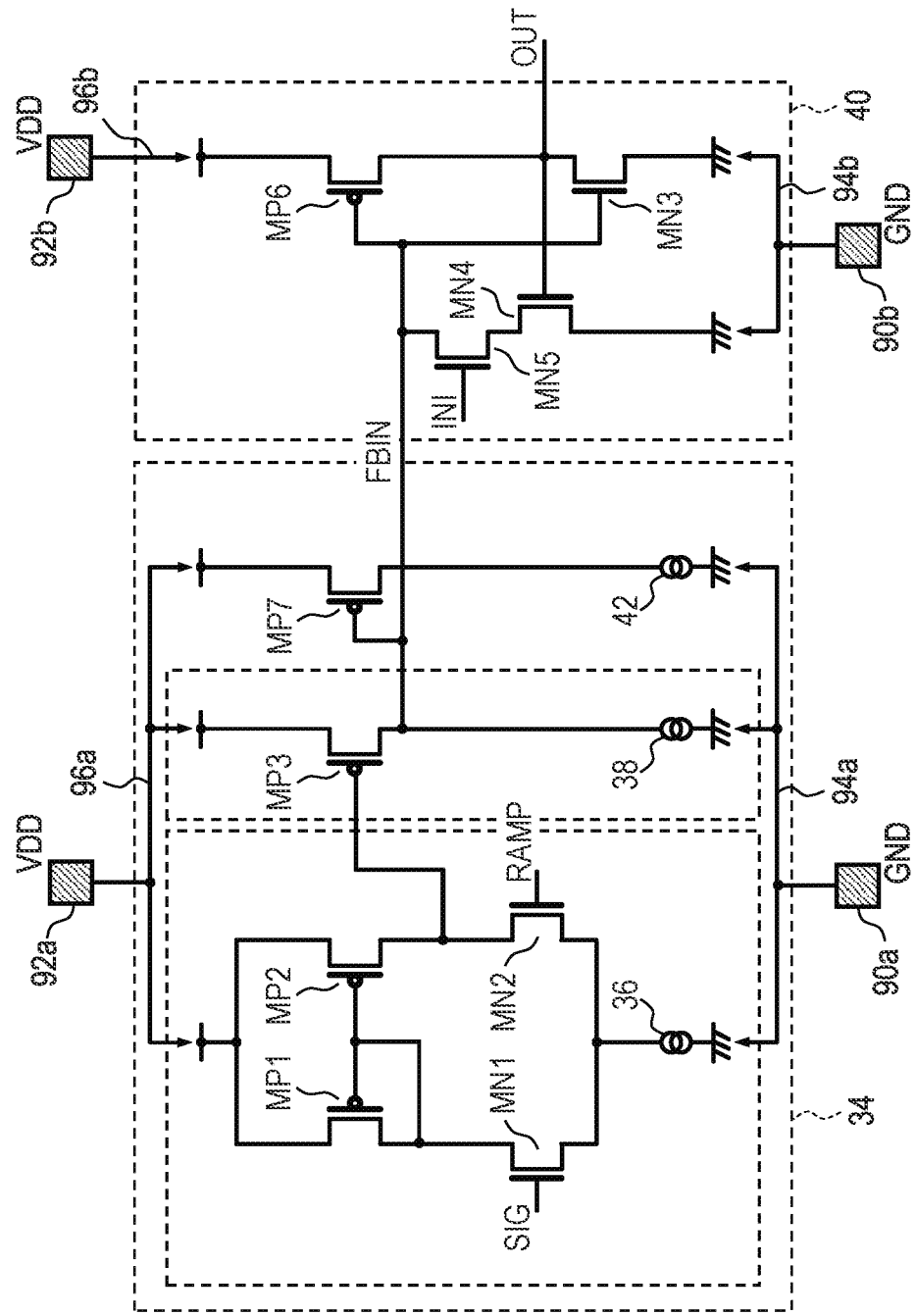
FIG. 14 is a circuit diagram illustrating a configuration example of a comparator in the photoelectric conversion device according to the fourth embodiment of the present invention (Part 2).

A photoelectric conversion device according to a fourth embodiment of the present invention will be described with reference to FIG. 12 to FIG. 14. The same components as those of the photoelectric conversion device according to the first to third embodiments are labeled with the same references, and the description thereof will be omitted or simplified. FIG. 12 and FIG. 14 are circuit diagrams illustrating configuration examples of a comparator in the photoelectric conversion device according to the present embodiment. FIG. 13 is a timing diagram illustrating the operation of the comparator in the photoelectric conversion device according to the present embodiment.

The photoelectric conversion device according to the present embodiment is the same as the photoelectric conversion device according to the third embodiment except for differences in the configuration of the comparator 32. That is, as illustrated in FIG. 12, the comparator 32 of the photoelectric conversion device according to the present embodiment, the comparison circuit 34 further includes the p-channel transistor MP7 and the current source 42. The source of the p-channel transistor MP7 is connected to the power supply voltage node. The current source 42 is connected between the drain of the p-channel transistor MP7 and the reference voltage node. The gate of the p-channel transistor MP7 is connected to the node FBIN. The current source 38 and the current source 42 are set to have approximately the same current value. Other features are the same as those in the comparator 32 of the third embodiment.

In the comparator 32 of the present embodiment, as illustrated in FIG. 13, when the potential of the node FBIN transitions from the H level to the L level, the drain-source voltage of the n-channel transistor MN6 forming the current source 38 becomes approximately 0 V, and current I1 of the current source 38 stops flowing. On the other hand, the potential of the node FBIN transitions from the H level to the L level, thereby the p-channel transistor MP7 is turned on, and current I2 of the current source 42 flows from the power supply voltage node to the reference voltage node. That is, when the potential of the node FBIN transitions from the H level to the L level, instead of the current I1 stopping flowing in the current source 38, the current I2 starts flowing in the current source 42. Therefore, if the current source 38 and the current source 42 are set to have approximately the same current value in advance, current fluctuations of the current source 38 and the current source 42 are cancelled or reduced. Accordingly, it is possible to suppress the potential fluctuation of the power supply voltage VDD or the reference voltage GND and reduce the AD conversion error.

Also in the comparator 32 of the present embodiment, as illustrated in FIG. 14, the reference voltage node arranged in the comparison circuit 34 and the reference node arranged in the positive feedback circuit 40 may be connected to the separate reference voltage pads 90a and 90b via the separate interconnections 94a and 94b, respectively, in the same manner as in the second embodiment. Further, the power supply voltage node arranged in the comparison circuit 34 and the power supply voltage node arranged in the positive feedback circuit 40 may be connected to the separate power supply voltage pads 92a and 92b via the separate interconnections 96a and 96b, respectively. With such a configuration, it is possible to suppress influence on the comparison circuit 34 caused by a fluctuation of the power supply voltage VDD or the reference voltage GND due to an inversion operation in the positive feedback circuit 40 and further reduce the AD conversion error.

Note that, although both the source of the n-channel transistor MN5 and the source of the n-channel transistor MN3 are separated from the reference voltage pad 90a and the interconnection 94a in the configuration example of FIG. 14, any one of the source of the n-channel transistor MN5 and the source of the n-channel transistor MN3 may be separated from the reference voltage pad 90a and the interconnection 94a. Also in the case of such a configuration, it is possible to suppress influence on the comparison circuit 34 caused by a fluctuation of the power supply voltage VDD or the reference voltage GND due to an inversion operation in the positive feedback circuit 40, though the effect is reduced compared to the configuration example of FIG. 14.

Further, the reference voltage node arranged in the comparison circuit 34 and the reference node arranged in the positive feedback circuit 40 may be connected to the same reference voltage pad 90 via the separate interconnections 94a and 94b, respectively, in the same manner as in the configuration example illustrated in FIG. 6. Further, the power supply voltage node arranged in the comparison circuit 34 and the power supply voltage node arranged in the positive feedback circuit 40 may be connected to the same power supply voltage pad 92 via the separate interconnections 96a and 96b, respectively.

As described above, according to the present embodiment, it is possible to suppress a malfunction of the comparator 32 due to variation of off-peak current of transistors. Further, in the same manner as in the first embodiment, it is possible to suppress a malfunction of the comparator 32 due to variation of off-peak current of transistors. It is therefore possible to reduce an AD conversion error by using such a comparator to form an AD conversion circuit. Further, it is possible to acquire a high quality image with a smaller AD conversion error by using such an AD conversion circuit to form a photoelectric conversion device.

Note that, although the amplifier unit including the p-channel transistor MP7 and the current source 42 on the output stage of the comparison circuit 34 is provided in the present embodiment, a clip circuit that limits the level of the node FBIN may be provided.

Fifth Embodiment

A photoelectric conversion device according to a fifth embodiment of the present invention will be described with reference to FIG. 15 to FIG. 18. The same components as those of the photoelectric conversion device according to the first to fourth embodiments are labeled with the same references, and the description thereof will be omitted or simplified. FIG. 15 to FIG. 18 are circuit diagrams illustrating configuration examples of a comparator in the photoelectric conversion device according to the present embodiment.

Figure 15:
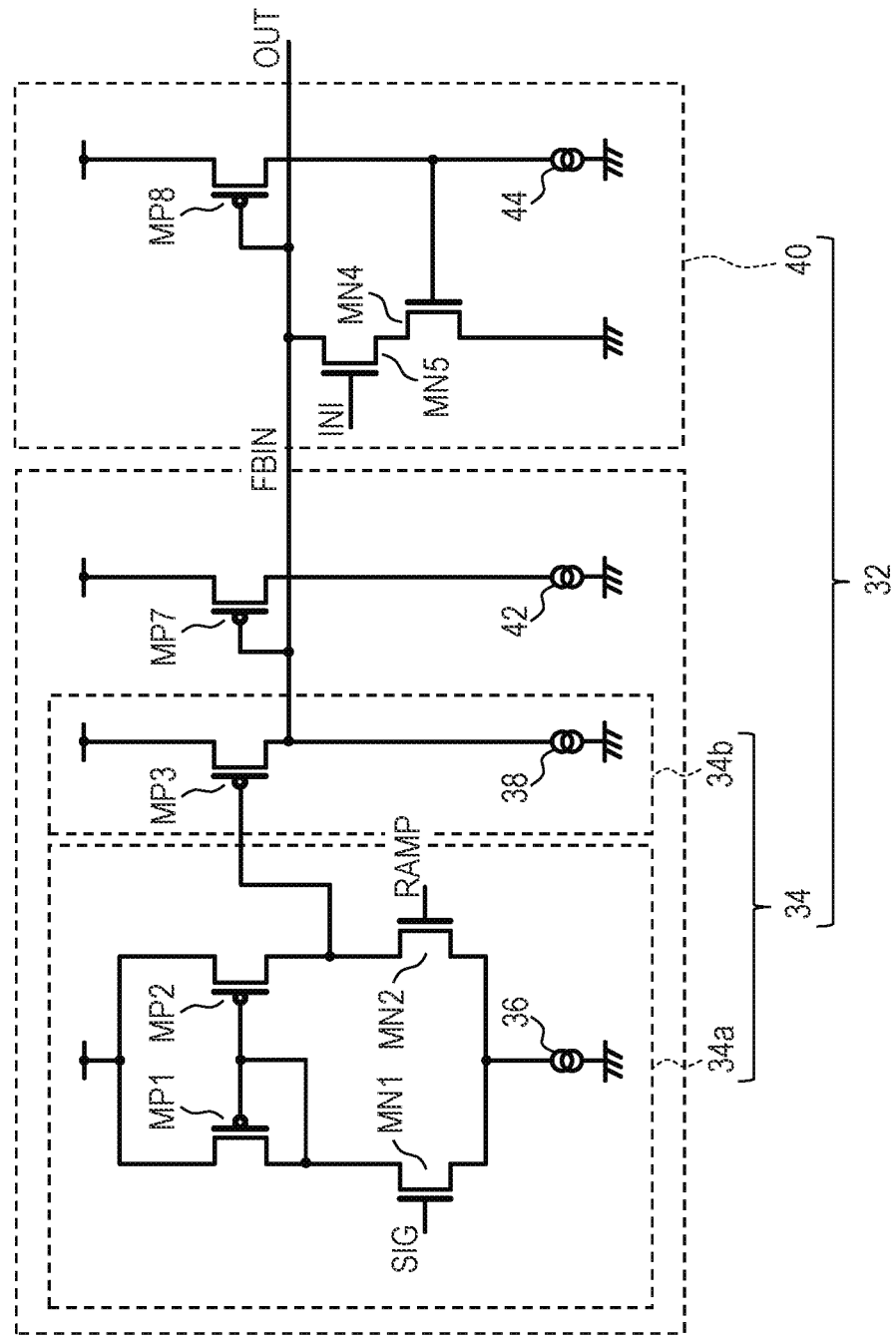
FIG. 15 is a circuit diagram illustrating a configuration example of a comparator in a photoelectric conversion device according to a fifth embodiment of the present invention (Part 1).

The photoelectric conversion device according to the present embodiment is the same as the photoelectric conversion device according to the first to fourth embodiments except for differences in the configuration of the comparator 32. That is, as illustrated in FIG. 15, the comparator 32 of the photoelectric conversion device according to the present embodiment includes an amplifier unit including the p-channel transistor MP8 and the current source 44 instead of a CMOS inverter of the positive feedback circuit 40 in the comparator 32 of the fourth embodiment. That is, the positive feedback circuit 40 of the fifth embodiment is formed of the amplifier unit including the p-channel transistor MP8 and the current source 44 and the positive feedback unit including the n-channel transistors MN4 and MN5. The output node of the positive feedback circuit 40 (node OUT) is connected to the same node as the input node of the positive feedback circuit 40 (node FBIN).

When a positive feedback circuit 40 is formed using a logic gate such as a MOS inverter, through-current may flow from the power supply voltage node to the reference voltage node at transition of the input/output signal level. Such through-current typically has a full width at half maximum of around several nano seconds and a peak value of around several tens of micro amperes. Although FIG. 1 and FIG. 8 illustrate four comparison circuits 34 and four positive feedback circuits 40 as a column circuit for four columns, several hundreds to several thousands of column circuits are typically provided in the actual implementation, and significantly large through-current may occur in response to inversion operations of the positive feedback circuits 40.

At this time, since a finite impedance is attached to the power supply voltage node and the reference voltage node, large through-current may cause a large potential fluctuation to occur in the power supply voltage VDD or the reference voltage GND. Accordingly, there will be a difference in the inversion timing in accordance with the number of positive feedback circuits 40 inverted at the same time, and a large error may occur in an AD conversion result. In other words, the AD conversion error may be significantly increased because of the interference due to inversion operations of other positive feedback circuits 40.

In this regards, in the present embodiment, with the use of an amplifier using a current source load (current source 44) for the positive feedback circuit 40, the potential fluctuation of the power supply voltage VDD or the reference voltage GND is suppressed. Although a reduction in the potential of the node FBIN at time t4 of FIG. 13 causes the p-channel transistor MP8 to transition from the off-state to the on-state where current of the current source 44 flows, the current value of the current source 44 is typically around several hundreds of nano amperes to several micro amperes. Therefore, compared to the case where a positive feedback circuit is formed using a logic gate, it is possible to reduce the peak value of current by around one to two digits. Therefore, according to the configuration of the comparator 32 of the present embodiment, it is possible to suppress interference between the positive feedback circuits 40 and reduce the AD conversion error.

Figure 16:
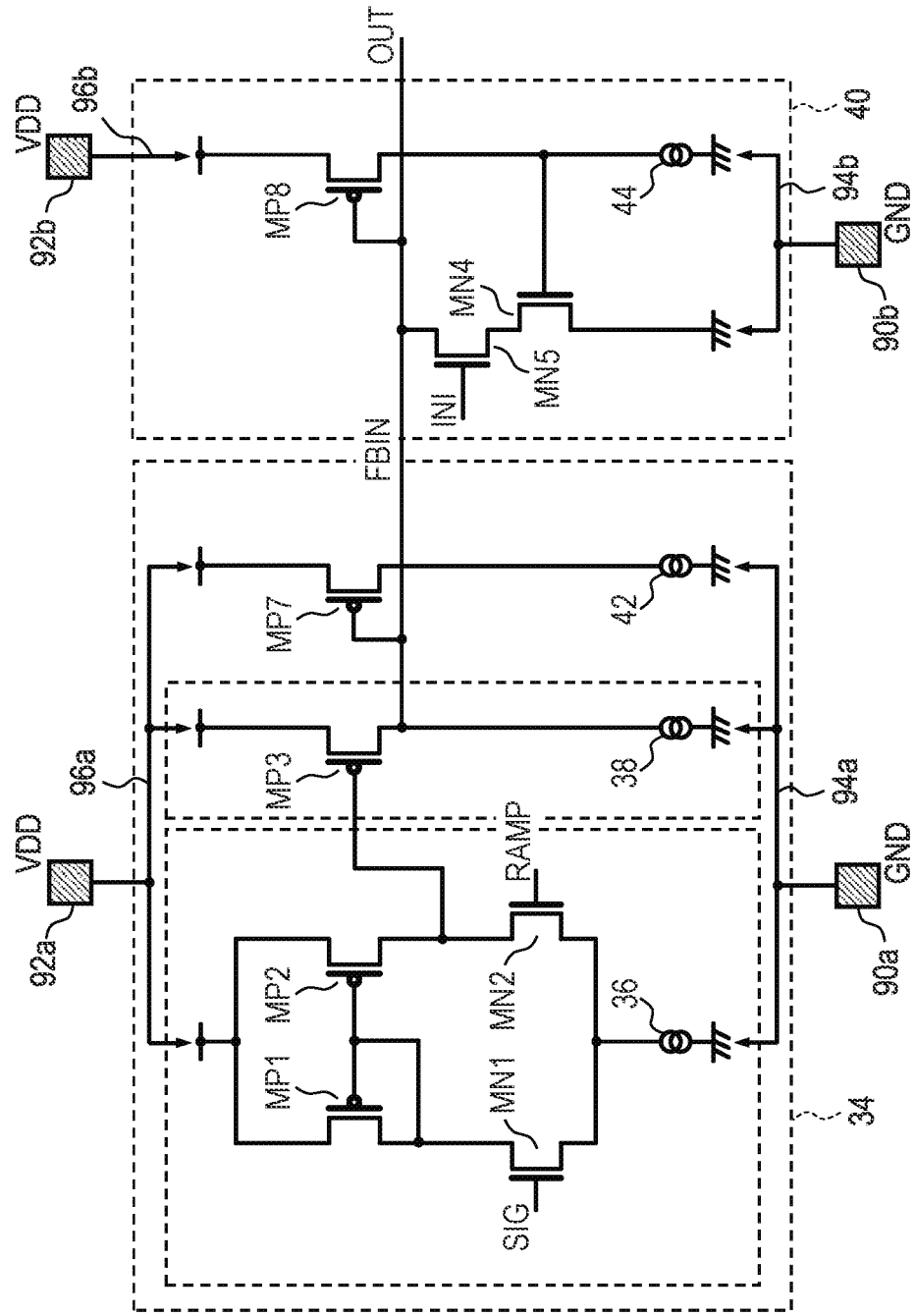
FIG. 16 is a circuit diagram illustrating a configuration example of a comparator in the photoelectric conversion device according to the fifth embodiment of the present invention (Part 2).

Also in the comparator 32 of the present embodiment, as illustrated in FIG. 16, the reference voltage node arranged in the comparison circuit 34 and the reference node arranged in the positive feedback circuit 40 may be connected to the separate reference voltage pads 90a and 90b via the separate interconnections 94a and 94b, respectively, in the same manner as in the second embodiment. Further, the power supply voltage node arranged in the comparison circuit 34 and the power supply voltage node arranged in the positive feedback circuit 40 may be connected to the separate power supply voltage pads 92a and 92b via the separate interconnections 96a and 96b, respectively. With such a configuration, it is possible to suppress influence on the comparison circuit 34 caused by a fluctuation of the power supply voltage VDD or the reference voltage GND due to an inversion operation in the positive feedback circuit 40 and further reduce the AD conversion error.

Further, the reference voltage node arranged in the comparison circuit 34 and the reference node arranged in the positive feedback circuit 40 may be connected to the same reference voltage pad 90 via the separate interconnections 94a and 94b, respectively, in the same manner as in the configuration example illustrated in FIG. 6. Further, the power supply voltage node arranged in the comparison circuit 34 and the power supply voltage node arranged in the positive feedback circuit 40 may be connected to the same power supply voltage pad 92 via the separate interconnections 96a and 96b, respectively.

Figure 17:
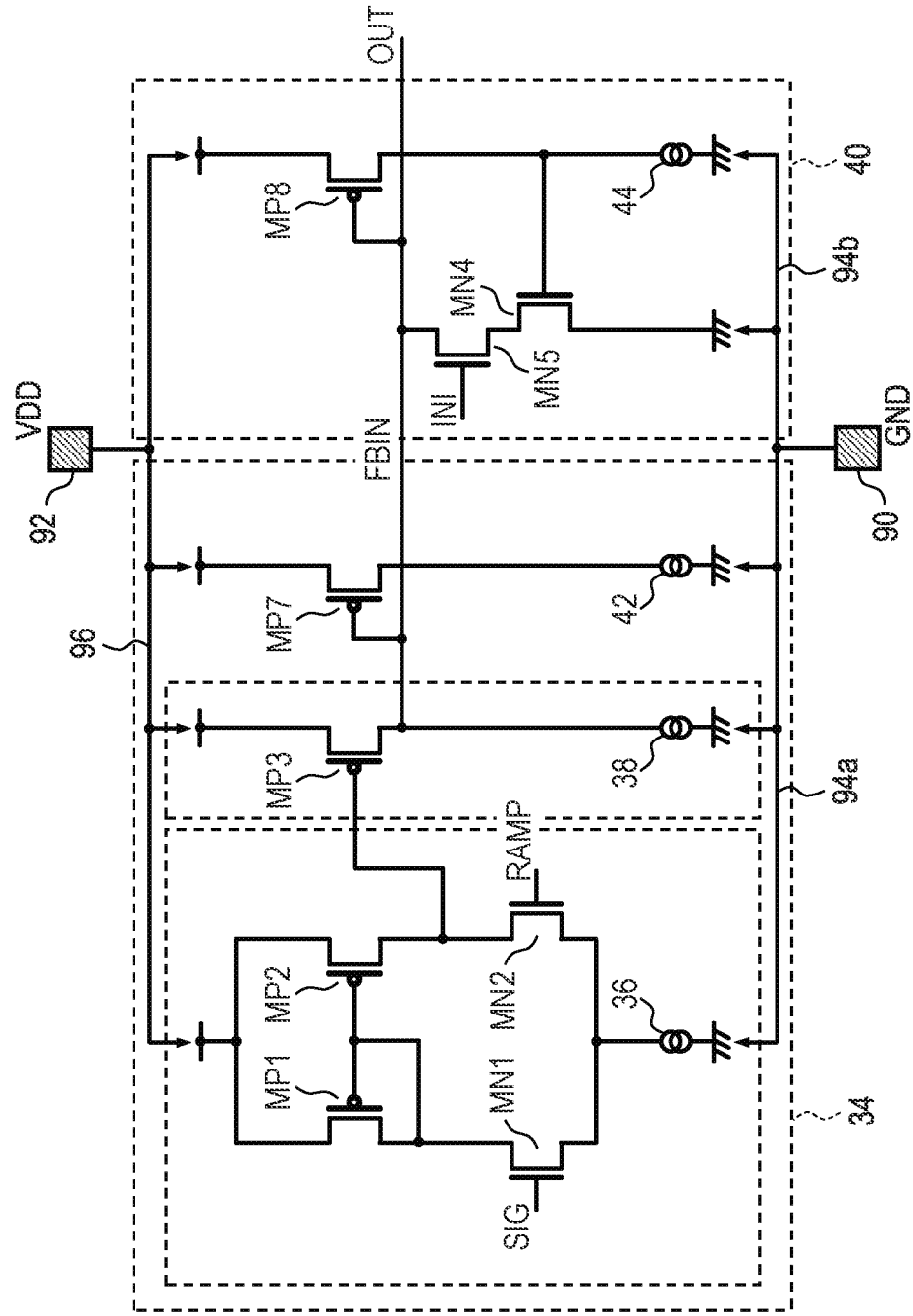
FIG. 17 is a circuit diagram illustrating a configuration example of a comparator in the photoelectric conversion device according to the fifth embodiment of the present invention (Part 3).
Figure 18:
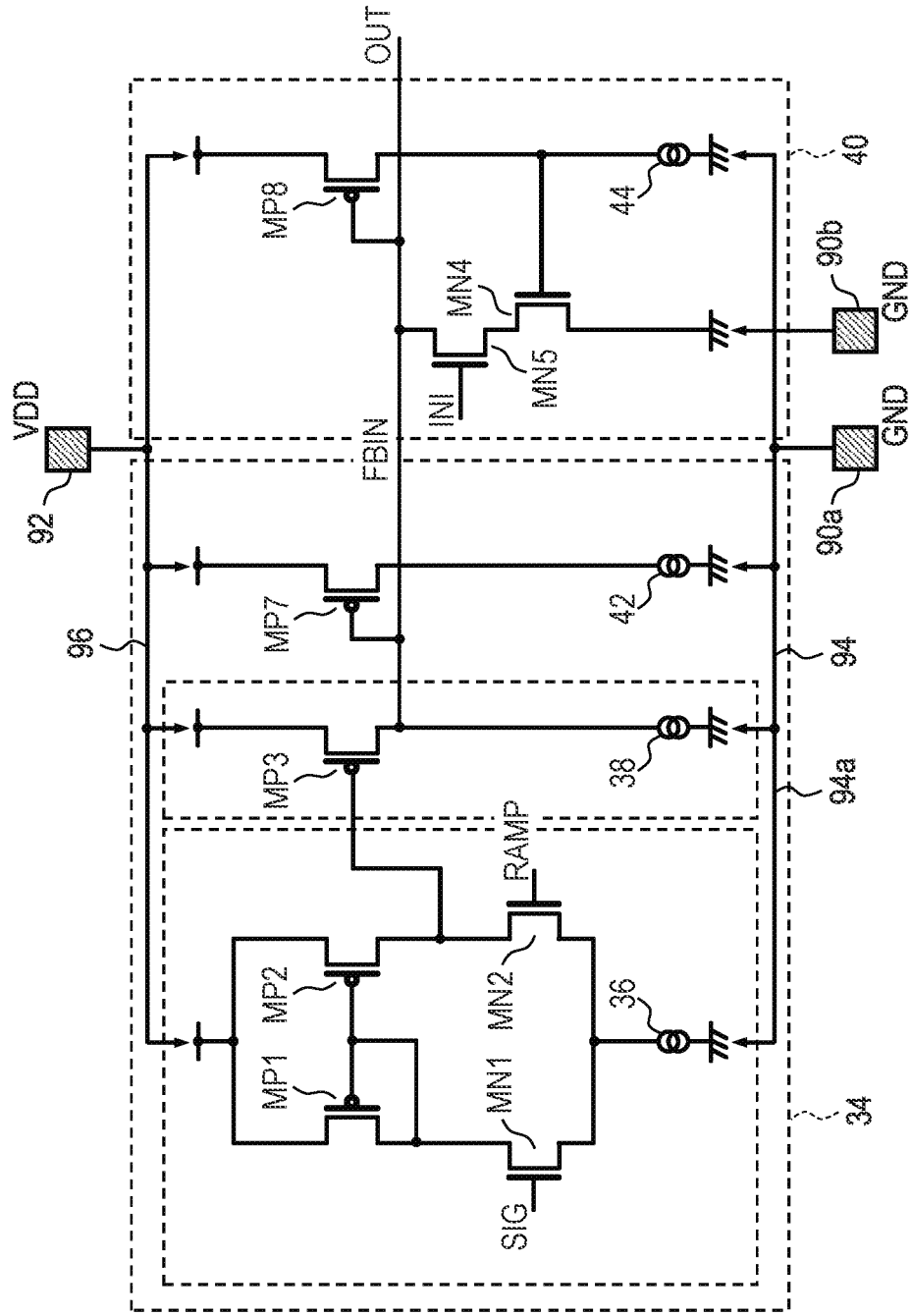
FIG. 18 is a circuit diagram illustrating a configuration example of a comparator in the photoelectric conversion device according to the fifth embodiment of the present invention (Part 4).

In the comparator 32 of the present embodiment, with the use of the amplifier using the p-channel transistor MP8 and the current source 44, fluctuations of the power supply voltage VDD and the reference voltage GND due to an inversion operation of the positive feedback circuit 40 are suppressed. Therefore, as illustrated in FIG. 17, for example, the comparison circuit 34 and the positive feedback circuit 40 may be configured to use a common reference voltage pad 90. Further, the comparison circuit 34 and the positive feedback circuit 40 may be configured to use a common power supply voltage pad 92. With such a configuration, it is possible to reduce the number of pads. Alternatively, as illustrated in FIG. 18, for example, the reference voltage pad 90b connected to the reference voltage node connected to the source of the n-channel transistor MN4 and the reference voltage pad 90b connected to another reference voltage node arranged in the comparison circuit 34 and the positive feedback circuit 40 may be separated from each other.

As described above, according to the present embodiment, it is possible to suppress a malfunction of the comparator 32 due to variation of off-peak current of transistors. It is therefore possible to reduce an AD conversion error by using such a comparator to form an AD conversion circuit. Further, it is possible to acquire a high quality image with a smaller AD conversion error by using such an AD conversion circuit to form a photoelectric conversion device.

Sixth Embodiment

Figure 19:
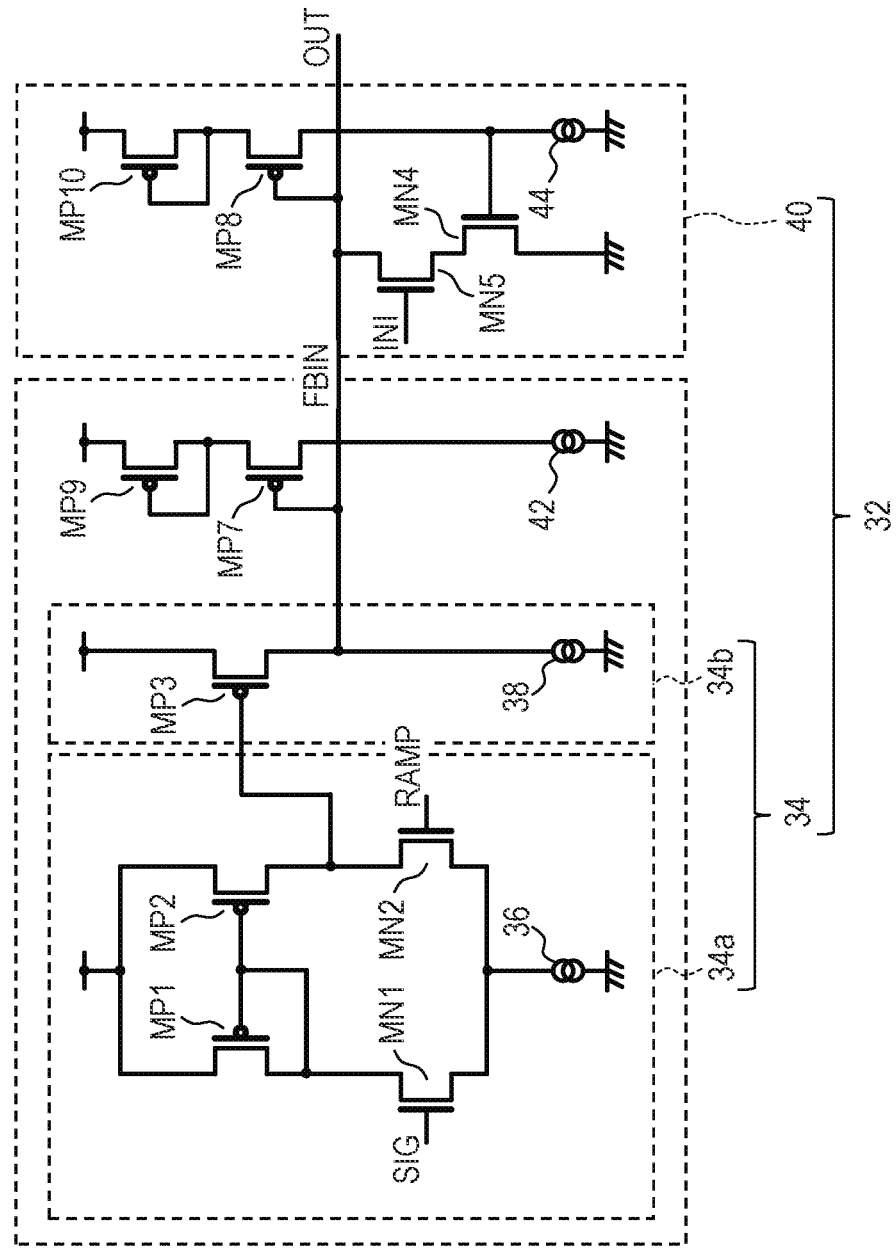
FIG. 19 is a circuit diagram illustrating a configuration example of a comparator in a photoelectric conversion device according to a sixth embodiment of the present invention.

A photoelectric conversion device according to a sixth embodiment of the present invention will be described with reference to FIG. 19. The same components as those of the photoelectric conversion device according to the first to fifth embodiments are labeled with the same references, and the description thereof will be omitted or simplified. FIG. 19 is a circuit diagram illustrating a configuration example of a comparator in the photoelectric conversion device according to the present embodiment.

The photoelectric conversion device according to the present embodiment is the same as the photoelectric conversion device according to the first to fifth embodiments except for differences in the configuration of the comparator 32. That is, as illustrated in FIG. 19, in the comparator 32 of the photoelectric conversion device according to the present embodiment, the positive feedback circuit 40 further includes the p-channel transistors MP9 and MP10 in the positive feedback circuit 40 of the fifth embodiment. The p-channel transistor MP9 forms the amplifier unit of the comparison circuit 34 together with the p-channel transistor MP7 and the current source 42. Further, the p-channel transistor MP10 forms the amplifier unit of the positive feedback circuit 40 together with the p-channel transistor MP8 and the current source 44.

The p-channel transistor MP9 is connected between the source of the p-channel transistor MP7 and the power supply voltage node. That is, the source of the p-channel transistor MP9 is connected to the power supply voltage node. The gate and the drain of the p-channel transistor MP9 are connected to the source of the p-channel transistor MP7. Further, the p-channel transistor MP10 is connected between the source of the p-channel transistor MP8 and the power supply voltage node. That is, the source of the p-channel transistor MP10 is connected to the power supply voltage node. The gate and the drain of the p-channel transistor MP10 are connected to the source of the p-channel transistor MP8.

With the p-channel transistor MP9 being provided between the p-channel transistor MP7 and the power supply voltage node, the gate-source voltage Vgs of the p-channel transistor MP7 drops by the gate-source voltage Vgs of the p-channel transistor MP9. Similarly, with the p-channel transistor MP10 being provided between the p-channel transistor MP8 and the power supply voltage node, the gate-source voltage Vgs of the p-channel transistor MP8 drops by the gate-source voltage Vgs of the p-channel transistor MP10. Accordingly, the off-leak current of the p-channel transistors MP7 and MP8 after the node FBIN transitions to the H level can be reduced, and the power consumption can be reduced. Further, a reduction of the off-leak current of the p-channel transistors MP7 and MP8 can suppress the relationship of current cancellation between the current sources 38 and the current source 42 from being compromised. As a result, it is possible to further suppress the potential fluctuation of the power supply voltage VDD or the reference voltage GND and reduce the AD conversion error.

As described above, according to the present embodiment, it is possible to suppress a malfunction of the comparator 32 due to variation of off-peak current of transistors. It is therefore possible to reduce an AD conversion error by using such a comparator to form an AD conversion circuit. Further, it is possible to acquire a high quality image with a smaller AD conversion error by using such an AD conversion circuit to form a photoelectric conversion device.

Seventh Embodiment

A photoelectric conversion device according to a seventh embodiment of the present invention will be described with reference to FIG. 20 and FIG. 21. The same components as those of the photoelectric conversion device according to the first to sixth embodiments are labeled with the same references, and the description thereof will be omitted or simplified.

Figure 20:
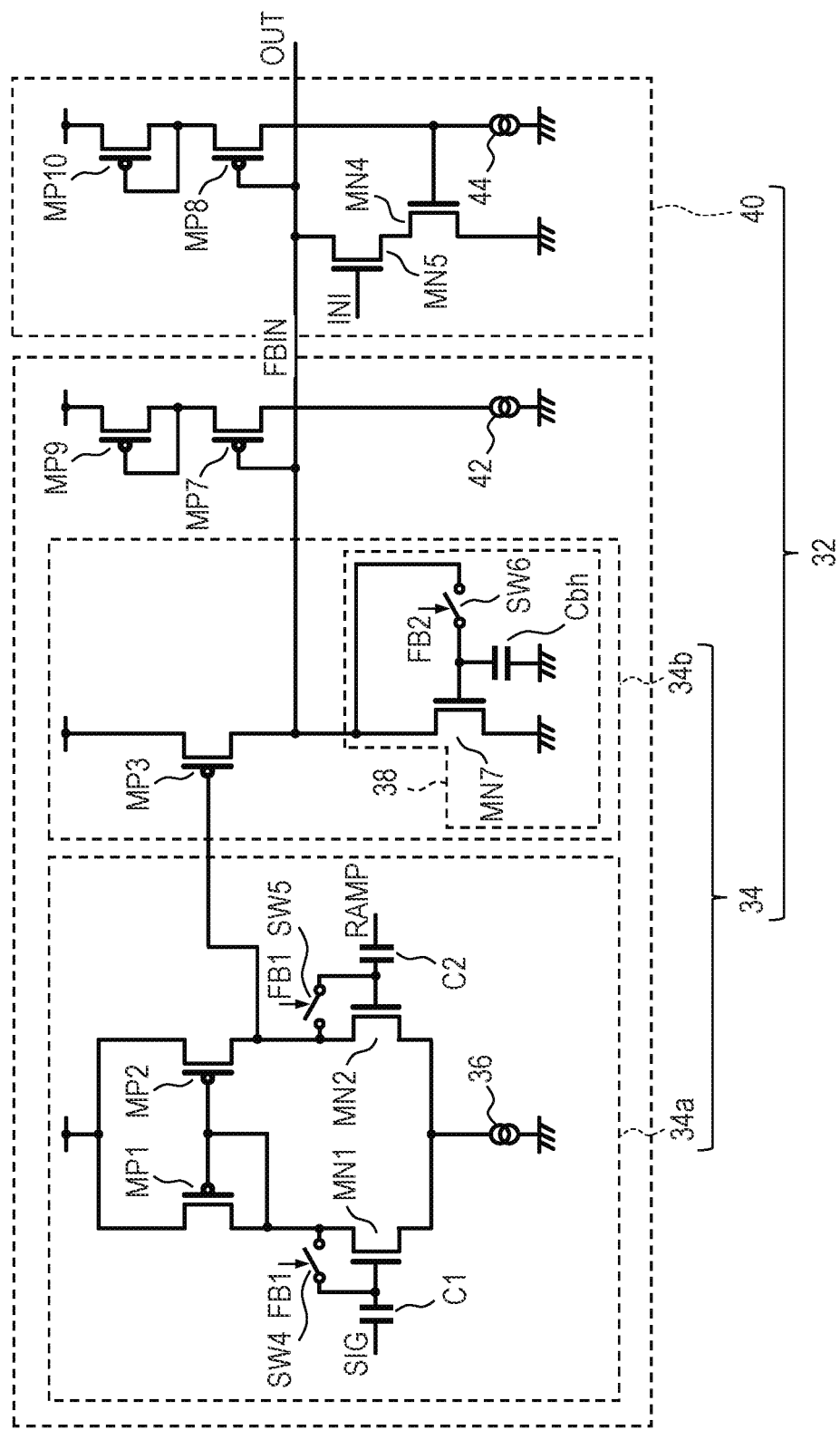
FIG. 20 is a circuit diagram illustrating a configuration example of a comparator in a photoelectric conversion device according to a seventh embodiment of the present invention.

FIG. 20 is a circuit diagram illustrating a configuration example of a comparator in the photoelectric conversion device according to the present embodiment. The photoelectric conversion device according to the present embodiment is the same as the photoelectric conversion device according to the sixth embodiment except for differences in the configuration of the comparison circuit 34.

That is, as illustrated in FIG. 20, the comparison circuit 34 in the photoelectric conversion device of the present embodiment further includes switches SW4 and SW5 and clamp capacitors C1 and C2 in the comparison circuit 34 of the sixth embodiment. The switch SW4 is connected between the gate and the drain of the n-channel transistor MN1. The signal SIG is supplied to the gate of the n-channel transistor MN1 via the clamp capacitor C1. The switch SW5 is connected between the gate and the drain of the n-channel transistor MN2. The reference signal RAMP is supplied to the gate of the n-channel transistor MN2 via the clamp capacitor C2. Each of the switches SW4 and SW5 is a switch whose connection state (conduction or non-conduction) is controlled by the control signal FB1 supplied from the control circuit 80.

Further, as illustrated in FIG. 20, the current source 38 of the comparison circuit 34 in the photoelectric conversion device of the present embodiment includes the n-channel transistor Mn7, the bias hold capacitor Cbh, and a switch SW6. The drain of the n-channel transistor MN7 is connected to the drain of the p-channel transistor MP3. The source of the n-channel transistor MN7 is connected to the reference voltage node. The gate of the n-channel transistor MN7 is connected to one of the electrodes of the bias hold capacitor Cbh. The other electrode of the bias hold capacitor Cbh is connected to the reference voltage node. Further, the switch SW6 is connected between the gate of the n-channel transistor MN7 and the connection node between the drain of the n-channel transistor MN7 and the drain of the p-channel transistor MP3. The switch SW6 is a switch whose connection state (conduction or non-conduction) is controlled by the control signal FB2 supplied from the control circuit 80.

With such a configuration of the comparison circuit 34, the comparison circuit 34 can have an offset cancellation function.

Figure 21:
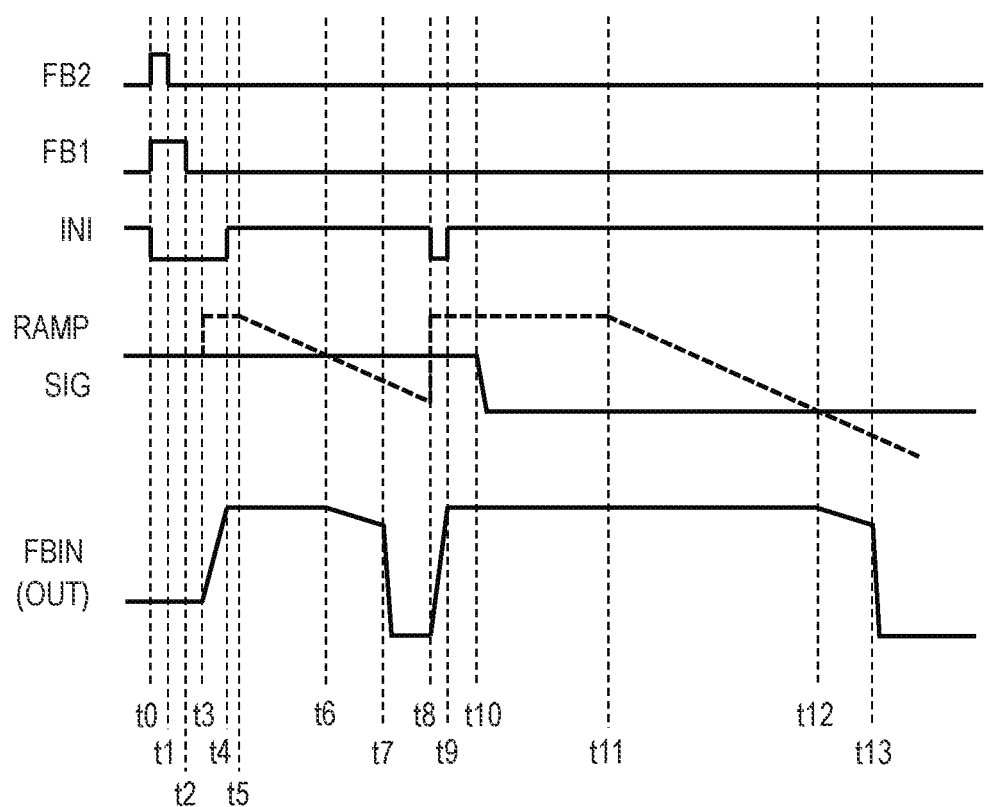
FIG. 21 is a timing diagram illustrating an operation of the comparator in the photoelectric conversion device according to the seventh embodiment of the present invention.

FIG. 21 is a timing diagram illustrating the operation of the comparator in the photoelectric conversion device according to the present embodiment. FIG. 21 illustrates the control signals FB2, FB1, and INI, the reference signal RAMP, the signal SIG of the output line 16, and the potential of the node FBIN (node OUT).

In the period before time t0, the control signals FB2 and FB1 are at the L level, and the control signal INI is at the H level. Further, a signal in accordance with the reset level of the pixel 12 (noise signal) is output to the output line 16 as the signal SIG.

First, at time t0, the control circuit 80 controls the control signal INI from the H level to the L level to turn off the n-channel transistor MN5. Further, at the same time t0, the control circuit 80 controls the control signals FB1 and FB2 from the L level to the H level to turn on the switches SW4, SW5, and SW6. Accordingly, if the p-channel transistors MP1, MP2, and MP3 all have the same size, current having a current value that is the same as the half the current value of the tail current source 36 flows in the p-channel transistor MP3. As a result, the gate-source voltage Vgs of the p-channel transistor MP3 in accordance with the current amount is held in the bias hold capacitor Cbh. Further, the potential that is a reference to the signal SIG and the reference signal RAMP is clamped in the clamp capacitors C1 and C2.

At subsequent time t1, the control circuit 80 controls the control signal FB2 from the H level to the L level. Thereby, the switch SW6 transitions from the on-state to the off-state.

At subsequent time t2, the control circuit 80 controls the control signal FB1 from the H level to the L level. Thereby, the switches SW4 and SW5 transition from the on-state to the off-state.

At subsequent time t3, the reference signal generation circuit 48 increases the potential of the reference signal RAMP by a predetermined voltage. Thereby, the potential of the node FBIN increases gradually. The potential of the node FBIN increases, and thereby, at time t4, the p-channel transistors MP7 and MP8 transition from the on-state to the off-state.

Next, at time t4 when the p-channel transistors MP7 and MP8 are turned off, the control circuit 80 controls the control signal INI to transition from the L level to the H level to turn on the n-channel transistor MN5.

At subsequent time t5, the reference signal generation circuit 48 starts changing the potential level of the reference signal RAMP. The reference signal generation circuit 48 outputs the reference signal RAMP having a ramp waveform whose potential gradually decreases with time, for example. Further, the counter circuit 54 starts count in synchronization with the start of the change in the potential level of the reference signal RAMP and outputs a count signal indicating a count value to the count signal line 54a.

At subsequent time t6, it is assumed that the level of the reference signal RAMP decreases below the level of the signal SIG in accordance with the reset level of the pixel 12. In response, the gate potential of the p-channel transistor MP3 starts increasing gradually from time t6, and thereby the potential of the node FBIN starts decreasing gradually.

In the present embodiment, because of the clamping operation, an inversion operation of the comparison circuit 34 starts from time t6 when the level of the reference signal RAMP becomes the same as that on and before time t3 regardless of variation of the thresholds of the n-channel transistors MN1, MN2, and the like (offset of the comparison circuit 34). That is, with the use of the comparator 32 of the present embodiment, it is possible to cancel influence due to the offset of the comparison circuit 34.

Since the operation on and after subsequent time t6 is the same as that of the fourth embodiment described with reference to FIG. 13, the description thereof will be omitted here.

Note that, when the current of the tail current source 36 is the sub-threshold current of a transistor and is 10 nA, for example, the current flowing in the p-channel transistor MP3 in the period from time t0 to time t1 is around 5 nA. Further, the gate-source voltage Vgs of the n-channel transistor MN7 held in the bias hold capacitor Cbh becomes the potential below the threshold voltage in accordance with the current value of 5 nA. Herein, although the current of the tail current source 36 is sub-threshold current and is likely to vary, since a voltage in accordance with a current value including variation is held in the bias hold capacitor Cbh in the present embodiment, influence of variation is less likely to be notable. It is therefore possible to suppress variation of the inversion timings of the comparison circuits 34 affected by variation of current values of the tail current sources 36 or the like.

As described above, according to the present embodiment, it is possible to suppress a malfunction of the comparator 32 due to variation of off-peak current of transistors. It is therefore possible to reduce an AD conversion error by using such a comparator to form an AD conversion circuit. Further, it is possible to acquire a high quality image with a smaller AD conversion error by using such an AD conversion circuit to form a photoelectric conversion device.

Eighth Embodiment

Figure 22:
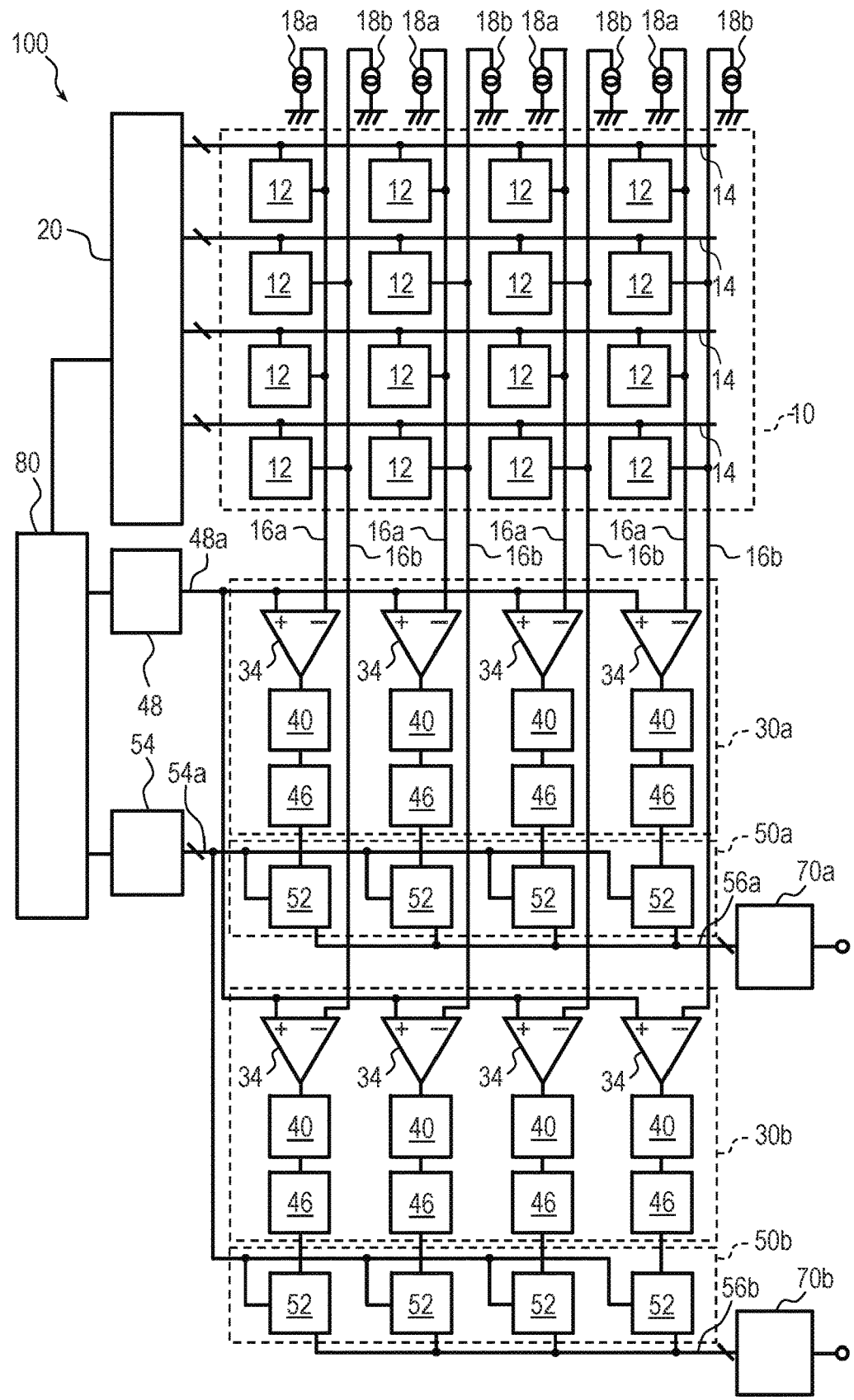
FIG. 22 is a block diagram (1) illustrating a general configuration of a photoelectric conversion device according to an eighth embodiment of the present invention.
Figure 23:
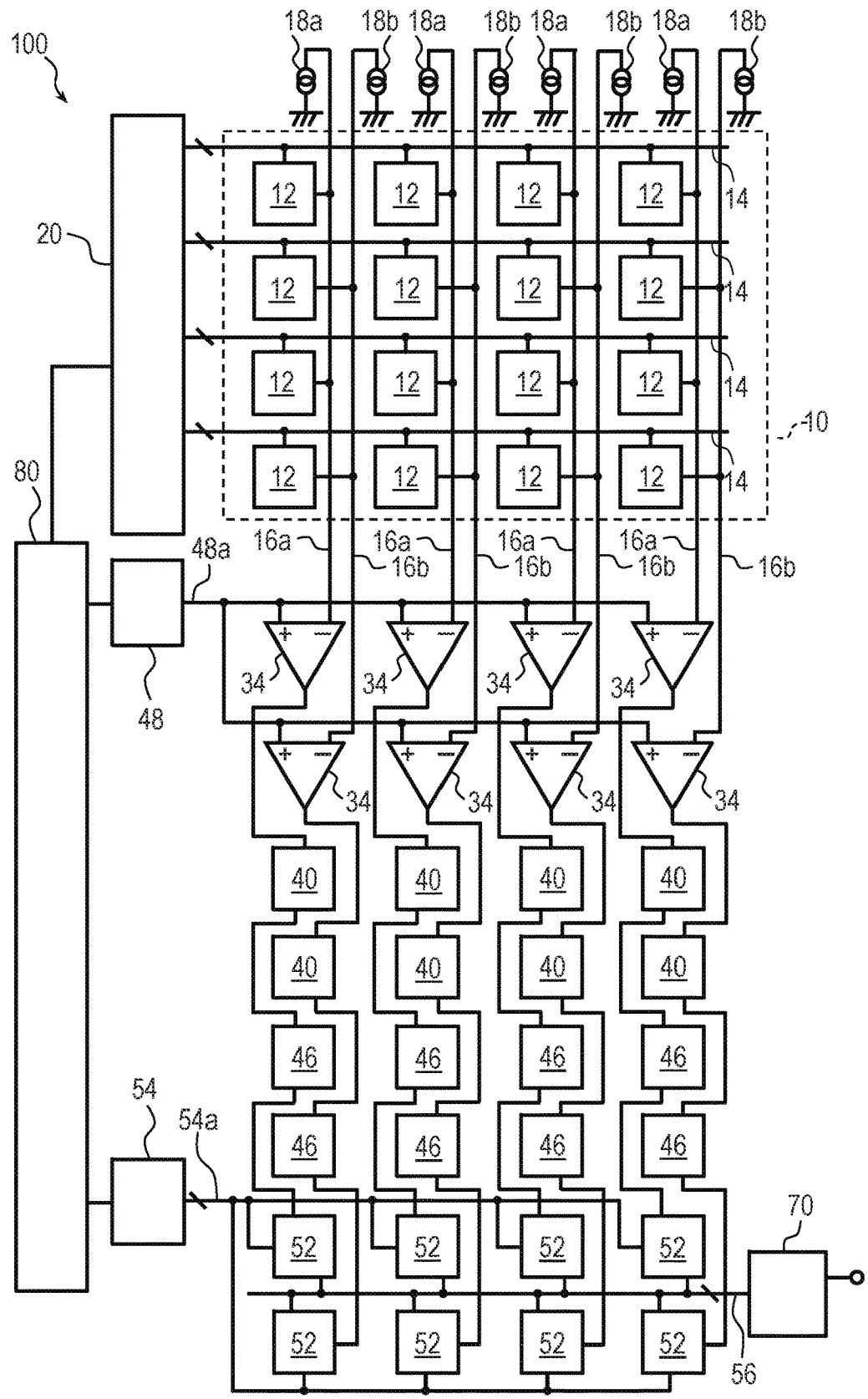
FIG. 23 is a block diagram (2) illustrating a general configuration of a photoelectric conversion device according to the eighth embodiment of the present invention.

A photoelectric conversion device according to an eighth embodiment of the present invention will be described with reference to FIG. 22 and FIG. 23. The same components as those of the photoelectric conversion device according to the first to seventh embodiments are labeled with the same references, and the description thereof will be omitted or simplified. FIG. 22 and FIG. 23 are block diagrams illustrating general configurations of the photoelectric conversion devices according to the present embodiment.

Although the photoelectric conversion device configured such that a single output line 16 is arranged on each column and pixel signals are read out on a row basis has been illustrated in the first to seventh embodiments, it is also possible to apply a configuration in which a plurality of output lines 16 are arranged on each column and pixel signals for a plurality of rows are simultaneously read out. In the present embodiment, a photoelectric conversion device in which a plurality of output lines 16 are arranged on each column and pixel signals for a plurality of rows can be simultaneously read out will be described.

In the photoelectric conversion device 100 according to the present embodiment, as illustrated in FIG. 22 and FIG. 23, two output lines 16a and 16b are arranged on each column of the pixel array unit 10, and the pixels 12 connected to the output line 16a and the pixels 12 connected to the output line 16b are divided on a row basis. Note that, in FIG. 22 and FIG. 23, illustration of the horizontal scanning circuit 60 is omitted to simplify the drawings.

In the configuration example illustrated in FIG. 22, two sets of readout circuits each formed of the AD conversion circuit unit 30, the memory unit 50, and the output circuit 70 are provided in association with the output lines 16a and 16b. That is, the readout circuit connected to the output line 16a is formed of an AD conversion circuit unit 30a, a memory unit 50a, and an output circuit 70a. Further, the readout circuit connected to the output line 16b is formed of an AD conversion circuit unit 30b, a memory unit 50b, and an output circuit 70b. By providing two sets of the readout circuit, it is possible to read out the pixel signals of the pixels 12 of the pixel array unit 10 simultaneously for two rows and realize a fast readout operation. Note that, although the two sets of readout circuits are arranged on one side of the pixel array unit 10 in the configuration example illustrated in FIG. 22, the two sets of readout circuits may be arranged so as to interpose the pixel array unit 10.

The configuration example illustrated in FIG. 23 is the same as the configuration example illustrated in FIG. 22 in terms of a circuit. The configuration example illustrated in FIG. 23 differs from the configuration example illustrated in FIG. 22 in that circuit blocks belonging to a different set of readout circuit and having the same function are arranged close to each other. That is, the comparison circuit 34 of the readout circuit connected to the output line 16a and the comparison circuit 34 of the readout circuit connected to the output line 16b are arranged close to each other. Further, the positive feedback circuit 40 of the readout circuit connected to the output line 16a and the positive feedback circuit 40 of the readout circuit connected to the output line 16b are arranged close to each other. Further, the pulse generator 46 of the readout circuit connected to the output line 16a and the pulse generator 46 of the readout circuit connected to the output line 16b are arranged close to each other. Further, the memory 52 of the readout circuit connected to the output line 16a and the memory 52 of the readout circuit connected to the output line 16b are arranged close to each other. Circuit blocks arranged close to each other are not necessarily required to be all the circuit blocks forming the readout circuit, and only some of the circuit blocks may be arranged close to each other. In particular, since the comparison circuits 34 and the positive feedback circuits 40 much affect the AD conversion error, it is desirable to arrange the comparison circuits 34 close to each other and arrange the positive feedback circuits 40 close to each other. By arranging circuit blocks having the same function close to each other in such a way, it is possible to increase relative accuracy between these circuit blocks and reduce the AD conversion error due to belonging to different readout circuits.

Note that, although FIG. 23 illustrates the example in which circuit blocks having the same function are arranged close to each other, it is more preferable to arrange circuit blocks having the same function close to each other on a circuit element basis, for example, on a transistor basis. With such a configuration, it is possible to suppress variation of circuit characteristics due to in-plane variation of element characteristics and further increase relative accuracy between circuit blocks having the same function.

Further, although two output lines 16a and 16b are arranged on each column of the pixel array unit 10 in the configuration examples of FIG. 22 and FIG. 23, three or more output lines 16 may be arranged on each column of the pixel array unit 10 to enable simultaneous readout of three or more rows.

As described above, according to the present embodiment, it is possible to suppress a malfunction of the comparator 32 due to variation of off-peak current of transistors. It is therefore possible to reduce an AD conversion error by using such a comparator to form an AD conversion circuit. Further, it is possible to acquire a high quality image with a smaller AD conversion error by using such an AD conversion circuit to form a photoelectric conversion device.

Ninth Embodiment

A photoelectric conversion device according to a ninth embodiment of the present invention will be described with reference to FIG. 24 to FIG. 26. The same components as those of the photoelectric conversion device according to the first to eighth embodiments are labeled with the same references, and the description thereof will be omitted or simplified.

Figure 24:
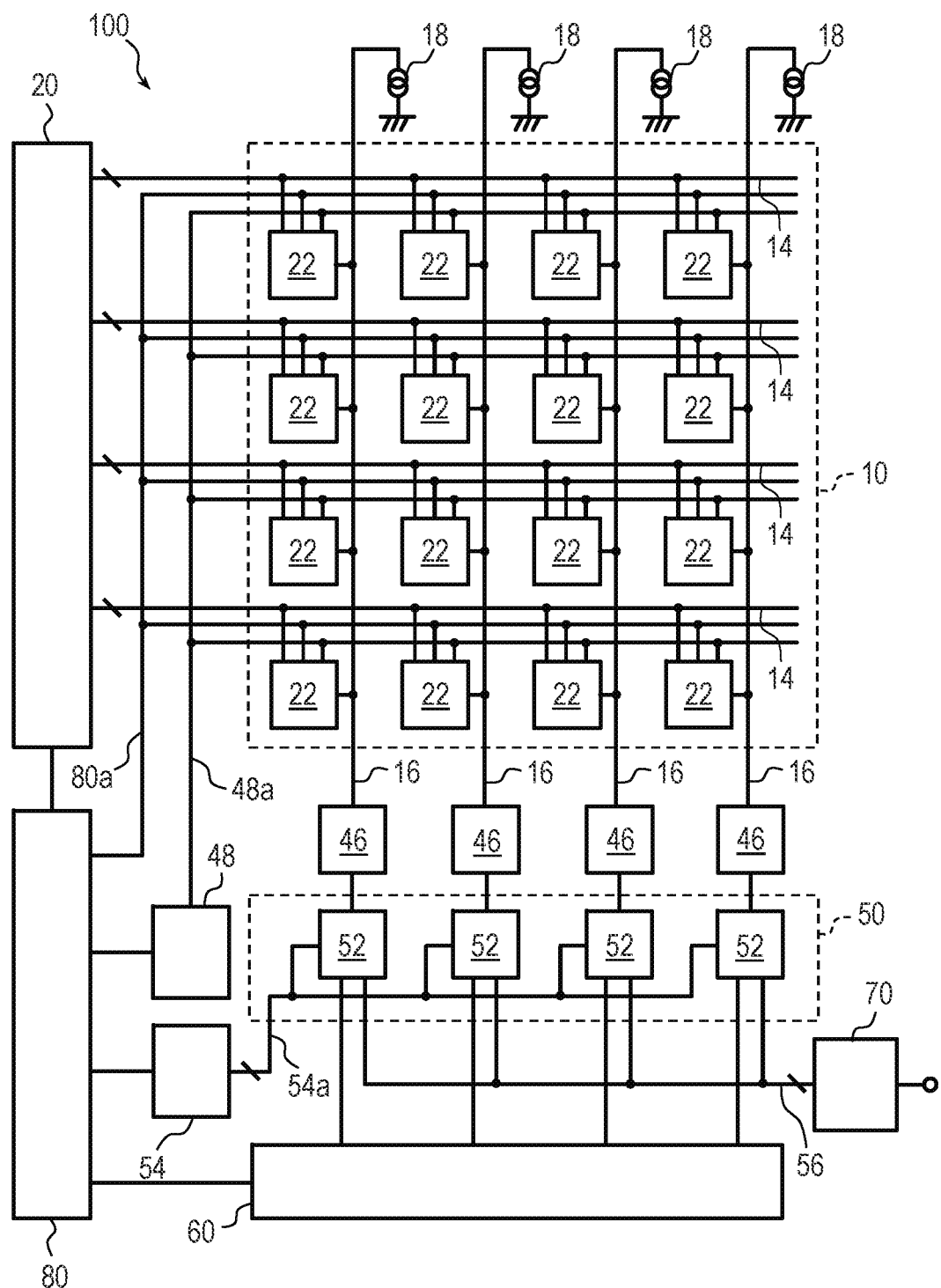
FIG. 24 is a block diagram illustrating a general configuration of a photoelectric conversion device according to a ninth embodiment of the present invention.

FIG. 24 is a block diagram illustrating the general configuration of the photoelectric conversion device according to the present embodiment. In the photoelectric conversion device 100 according to the present embodiment, a circuit unit corresponding to the pixel 12 and the comparator 32 of the first embodiment is defined as one pixel unit 22, and such pixel units 22 are arranged in a matrix over a plurality of rows and a plurality of columns in the pixel array unit 10.

On each row of the pixel array unit 10, the control line 14 is arranged extending in the first direction (horizontal direction in FIG. 24). Each of the control lines 14 is connected to the pixel units 22 aligned in the first direction, respectively, to form a signal line common to these pixel units 22.

The output node of the pixel unit 22 corresponds to the node OUT of the positive feedback circuit 40 and is connected to the output line 16 on each column. The output line 16 on each column is connected to the pulse generator 46 on a corresponding column. The circuit configuration of the pulse generator 46 and on the downstream stage thereof is the same as that in the previous embodiments.

The control signal INI is supplied to the plurality of pixel units 22 arranged in the pixel array unit 10 from the control circuit 80 via the control line 80a. Further, the reference signal RAMP is supplied to the plurality of pixel units 22 arranged in the pixel array unit 10 from the reference signal generation circuit 48 via the reference signal line 48a.

Figure 25:
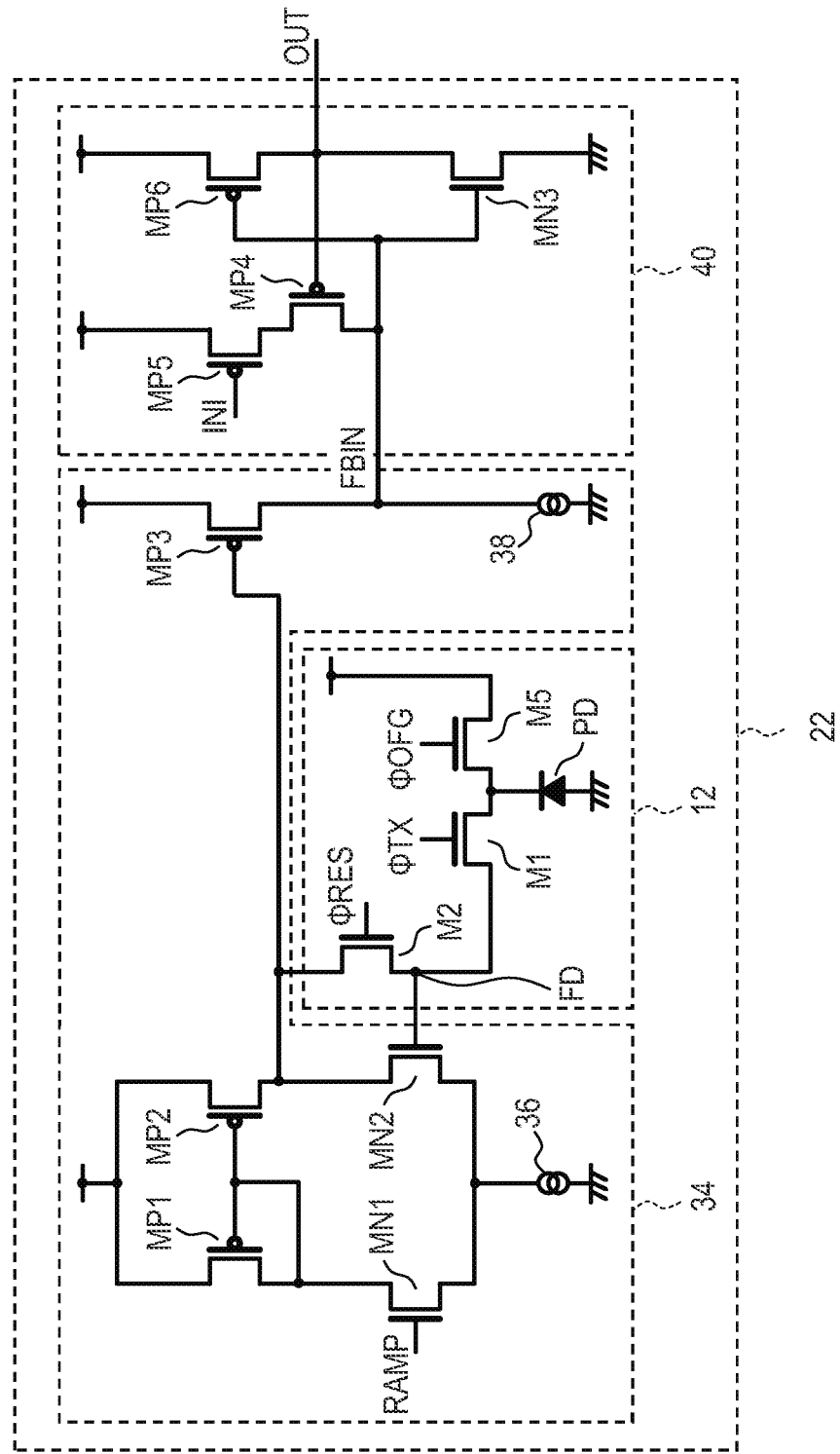
FIG. 25 is a circuit diagram illustrating a configuration example of a pixel unit in the photoelectric conversion device according to the ninth embodiment of the present invention.

FIG. 25 is a circuit diagram illustrating a configuration example of a pixel unit in the photoelectric conversion device according to the present embodiment. As illustrated in FIG. 25, each of the pixel units 22 includes the pixel 12, the comparison circuit 34, and the positive feedback circuit 40.

The pixel 12 may be formed of a photoelectric converter PD, a transfer transistor M1, a reset transistor M2, and an overflow transistor M5, as illustrated in FIG. 25, for example.

The photoelectric converter PD is a photodiode, for example, the anode thereof is connected to a reference voltage node, and the cathode thereof is connected to the source of the transfer transistor M1 and the source of the overflow transistor M5. The drain of the transfer transistor M1 is connected to the source of the reset transistor M2. The connection node of the drain of the transfer transistor M1 and the source of the reset transistor M2 is a floating diffusion portion FD. The floating diffusion portion FD corresponds to the output node of the pixel 12 and is connected to the gate of the n-channel transistor MN2 that is a non-inverting input terminal of the comparison circuit 34. The drain of the reset transistor M2 is connected to the connection node of the drain of the p-channel transistor MP2, the drain of the n-channel transistor MN2, and the gate of the p-channel transistor MP3. The drain of the overflow transistor M5 is connected to the power supply voltage node.

In the case of the circuit configuration of FIG. 25, the control line 14 on each row arranged in the pixel array unit 10 includes signal lines TX, RES, and OFG. The signal line TX is connected to the gates of the transfer transistors M1 of the pixel units 22 belonging to a corresponding row, respectively, to form a signal line common to these pixel units 22. The signal line RES is connected to the gates of the reset transistors M2 of the pixel units 22 belonging to a corresponding row, respectively, to form a signal line common to these pixel units 22. The signal line OFG is connected to the gates of the overflow transistors M5 of the pixel units 22 belonging to a corresponding row, respectively, to form a signal line common to these pixel units 22.

A control signal ΦTX that is a drive pulse used for controlling the transfer transistor M1 is supplied to the signal line TX from the vertical scanning circuit 20. A control signal ΦRES that is a drive pulse used for controlling the reset transistor M2 is supplied to the signal line RES from the vertical scanning circuit 20. A control signal ΦOFG that is a drive pulse used for controlling the overflow transistor M5 is supplied to the signal line OFG from the vertical scanning circuit 20. When each transistor is formed of an n-channel transistor, a corresponding transistor is turned on in response to a control signal at the H level being supplied from the vertical scanning circuit 20. Further, a corresponding transistor is turned off in response to a control signal at the L level being supplied from the vertical scanning circuit 20.

Note that, although FIG. 25 illustrates the example in which the comparison circuit 34 and the positive feedback circuit 40 of the first embodiment are applied as the comparison circuit 34 and the positive feedback circuit 40 of the pixel unit 22, the comparison circuit 34 and the positive feedback circuit 40 of another embodiment may be applied. Further, the circuit configuration of the pixel 12 is not limited to that illustrated in FIG. 25.

Figure 26:
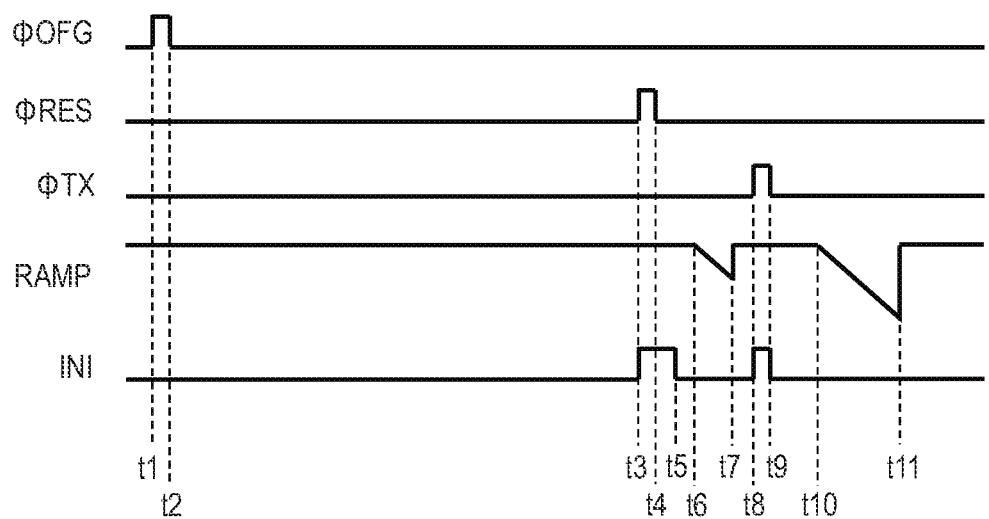
FIG. 26 is a timing diagram illustrating an operation of the photoelectric conversion device according to the ninth embodiment of the present invention.

FIG. 26 is a timing diagram illustrating the operation of the photoelectric conversion device according to the present embodiment. FIG. 26 illustrates the control signals ΦOFG, ΦRES, ΦTX, and INI and the reference signal RAMP.

In the period before time t1, the control signals ΦOFG, ΦRES, ΦTX, and INI are at the L level. Further, the reference signal RAMP is at a predetermined reference level.

In the period from time t1 to time t2, the vertical scanning circuit 20 controls the control signal ΦOFG of a row to be read out from the L level to the H level. Thereby, the overflow transistors M5 of the pixel units 22 belonging to a corresponding row are turned on, and charge of the photoelectric converters PD is reset. The timing when the control signal ΦOFG transitions from the H level to the L level is a start timing of an exposure period in the photoelectric converter PD.

In the subsequent period from time t3 to time t4, the vertical scanning circuit 20 controls the control signal ΦRES of a row to be read out from the L level to the H level. Thereby, the reset transistors M2 of the pixel units 22 belonging to a corresponding row are turned on, and charge of the floating diffusion portion FD is reset. The timing when the control signal ΦOFG transitions from the H level to the L level is a start timing of an exposure period in the photoelectric converter PD.

Further, in the period from time t3 to time t5, the control circuit 80 controls the control signal INI from the L level to the H level. Thereby, the p-channel transistor MP5 is turned off. Further, in the same period from time t0 to time t1, the level of the reference signal RAMP is in a state of being higher than the level of the signal SIG, the gate potential of the p-channel transistor MP3 is a level close to the power supply voltage, and the p-channel transistor MP3 is in an off-state. Accordingly, the potential of the node FBIN, which is the output node of the comparison circuit 34 and is also the input node of the positive feedback circuit 40 decreases to a potential close to the reference voltage due to the current caused to flow by the current source 38.

In the subsequent period from time t6 to time t7, the reference signal generation circuit 48 changes the potential level of the reference signal RAMP gradually and performs AD conversion on a signal in accordance with the reset level of the pixel 12.

In the subsequent period from time t8 to time t9, the vertical scanning circuit 20 controls the control signal ΦTX of a row to be read out from the L level to the H level. The timing when the control signal ΦTX transitions from the H level to the L level is an end timing of the exposure period in the photoelectric converter PD. Thereby, charge generated and accumulated in the photoelectric converter PD during the exposure period is transferred to the floating diffusion portion FD. The potential of the floating diffusion portion FD, which is also the inverting input terminal of the comparison circuit 34, is reduced to a potential in accordance with the amount of charge transferred from the photoelectric converter PD.

Further, in the same period from time t8 to time t9, the control circuit 80 controls the control signal INI from the L level to the H level. Thereby, the p-channel transistor MP5 is turned off. Further, in the same period from time t8 to time t9, the level of the reference signal RAMP is in a state of being higher than the level of the signal SIG, the gate potential of the p-channel transistor MP3 is a level close to the power supply voltage, and the p-channel transistor MP3 is in an off-state. Accordingly, the potential of the node FBIN, which is the output node of the comparison circuit 34 and is also the input node of the positive feedback circuit 40 decreases to a potential close to the reference voltage due to the current caused to flow by the current source 38.

In the subsequent period from time t10 to time t11, the reference signal generation circuit 48 changes the potential level of the reference signal RAMP gradually and performs AD conversion on a signal in accordance with the amount of signal charge.

Note that, although FIG. 26 illustrates only the control signals ΦOFG, ΦRES, and ΦTX of a single row, these control signals of a plurality of rows forming the pixel array unit 10 may be driven on a row basis or may be driven simultaneously for a plurality of rows. When a plurality of rows are driven simultaneously, multiple sets of readout circuits corresponding to the number of rows to be read out simultaneously are arranged as described in the ninth embodiment, for example. Alternatively, with respect to the control signal ΦTX, driving may be performed on a row basis, and readout may be performed in a time division manner on a row basis.

As described above, according to the present embodiment, it is possible to suppress a malfunction of a comparator due to variation of off-peak current of transistors. It is therefore possible to reduce an AD conversion error by using such a comparator to form an AD conversion circuit. Further, it is possible to acquire a high quality image with a smaller AD conversion error by using such an AD conversion circuit to form a photoelectric conversion device.

Note that, although the pixel unit 22 is formed of the pixel 12, the comparison circuit 34, and the positive feedback circuit 40 in the present embodiment, the pixel unit 22 may further include the pulse generator 46 or further include the pulse generator 46 and the memory 52.

Tenth Embodiment

Figure 27A:
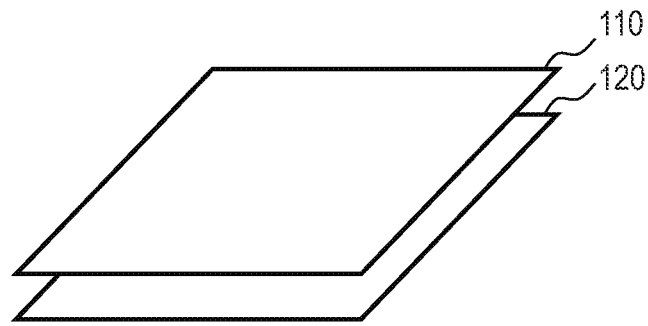
FIG. 27A and FIG. 27B are schematic diagrams illustrating a configuration example of a photoelectric conversion device according to a tenth embodiment of the present invention.
Figure 27B:
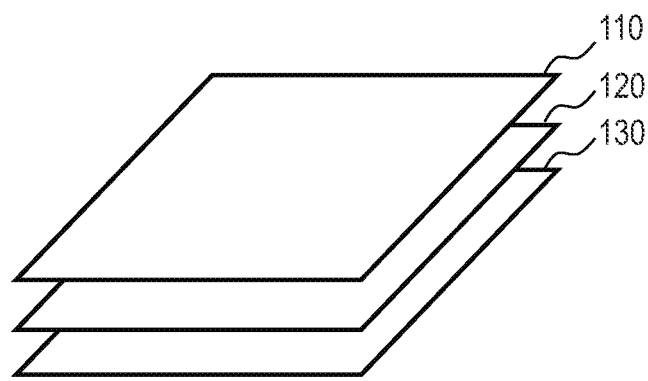

A photoelectric conversion device according to a tenth embodiment of the present invention will be described with reference to FIG. 27A and FIG. 27B. The same components as those of the photoelectric conversion device according to the first to ninth embodiments are labeled with the same references, and the description thereof will be omitted or simplified. FIG. 27A and FIG. 27B are schematic diagrams illustrating configuration examples of the photoelectric conversion device according to the present embodiment.

The photoelectric conversion device described in the first to ninth embodiments may be configured such that all the circuit blocks are arranged on a single substrate or such that a plurality of substrates are stacked to form a stacked type device and the circuit blocks are divided into respective substrates.

FIG. 27A is a schematic diagram of a case where a pixel substrate 110 on which the pixel array unit 10 is arranged and a circuit substrate 120 on which the remaining circuit blocks are arranged are stacked. With the pixel substrate 110 and the circuit substrate 120 being arranged as different substrates, it is possible to reduce the size of the photoelectric conversion device without sacrificing the area of the pixel array unit 10.

FIG. 27B is a schematic diagram of a case where a pixel substrate 110 on which the pixel array unit 10 is arranged and circuit substrates 120 and 130 on which the remaining circuit blocks are arranged are stacked. Also in such a case, it is possible to reduce the size of the photoelectric conversion device without sacrificing the area of the pixel array unit 10.

Note that circuit elements forming one function block are not necessarily required to be arranged on the same substrate and may be arranged on respective substrates. For example, out of the circuit elements forming the comparison circuit 34, the p-channel transistors MP1 and MP2 forming a current mirror may be arranged on one circuit substrate, and the n-channel transistors MN1 and MN2 forming a differential pair may be arranged on another circuit substrate. Alternatively, the p-channel transistors MP1 and MP2 forming a current mirror may be arranged on a circuit substrate, and the n-channel transistors MN1 and MN2 forming a differential pair may be arranged on a pixel substrate.

Eleventh Embodiment

Figure 28:
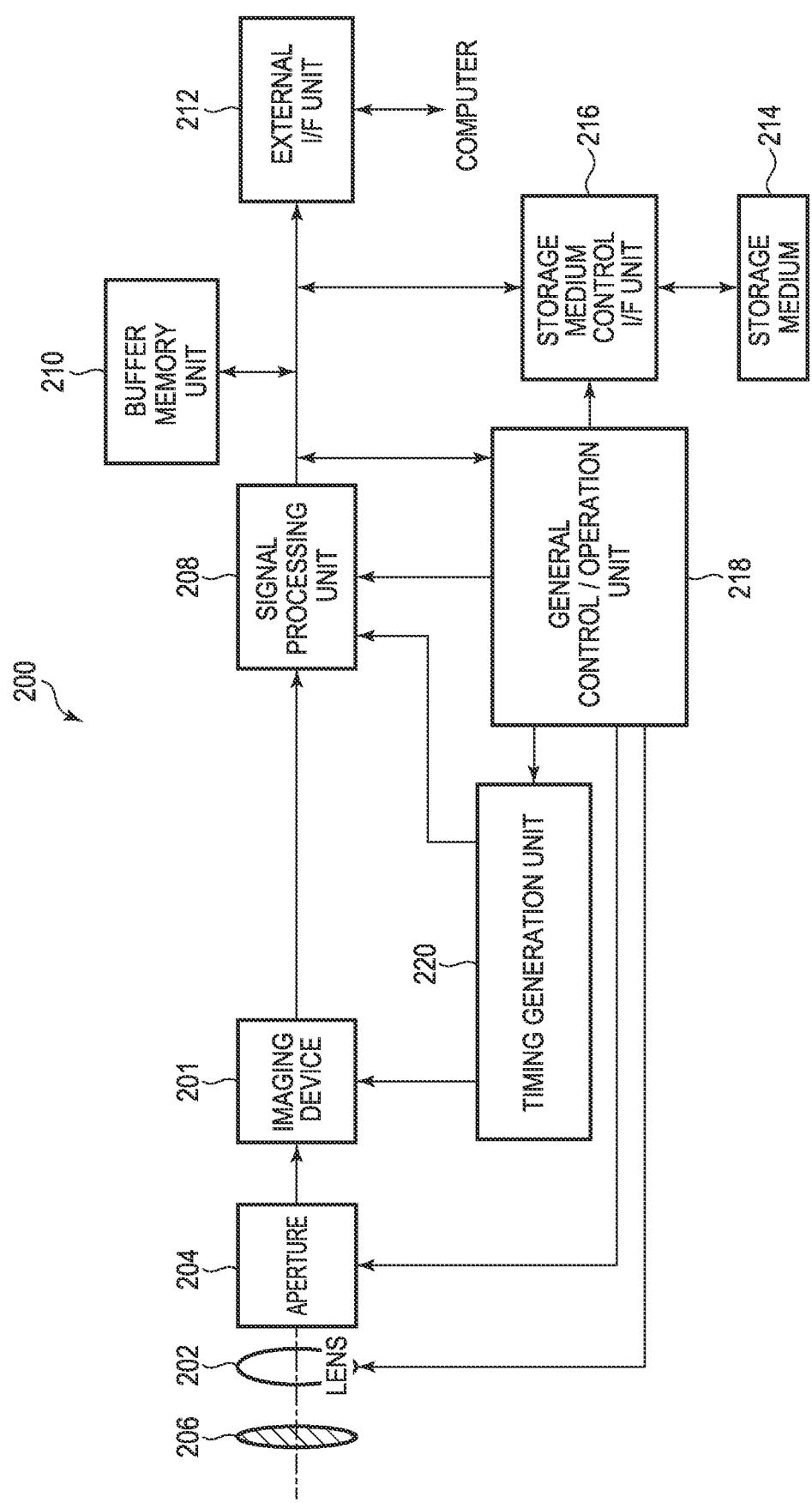
FIG. 28 is a block diagram illustrating a general configuration of an imaging system according to an eleventh embodiment of the present invention.

An imaging system according to an eleventh embodiment of the present invention will be described with reference to FIG. 28. FIG. 28 is a block diagram illustrating a general configuration of the imaging system according to the present embodiment.

The photoelectric conversion device 100 described in the above first to tenth embodiments can be applied to various imaging systems. Examples of applicable imaging systems may include a digital still camera, a digital camcorder, a surveillance camera, a copying machine, a fax machine, a mobile phone, an on-vehicle camera, an observation satellite, and the like. In addition, a camera module including an optical system such as a lens and an imaging device is also included in the imaging system. FIG. 28 illustrates a block diagram of a digital still camera as an example out of these examples.

An imaging system 200 illustrated as an example in FIG. 28 includes an imaging device 201, a lens 202 that captures an optical image of a subject onto the imaging device 201, an aperture 204 for changing a light amount passing through the lens 202, and a barrier 206 for protecting the lens 202. The lens 202 and the aperture 204 form an optical system that collects a light onto the imaging device 201. The imaging device 201 is the photoelectric conversion device 100 described in any of the first to twelfth embodiments and converts an optical image captured by the lens 202 into image data.

Further, the imaging system 200 includes a signal processing unit 208 that processes an output signal output from the imaging device 201. The signal processing unit 208 generates image data from digital signals output by the imaging device 201. Further, the signal processing unit 208 performs operations of performing various correction or compression to output image data, if necessary.

Furthermore, the imaging system 200 includes a memory unit 210 for temporarily storing image data therein and an external interface unit (external I/F unit) 212 for communicating with an external computer or the like. The imaging system 200 further includes a storage medium 214 such as a semiconductor memory for performing storage or readout of imaging data and a storage medium control interface unit (storage medium control I/F unit) 216 for performing storage or readout on the storage medium 214. Note that the storage medium 214 may be embedded in the imaging system 200 or may be removable.

Furthermore, the imaging system 200 includes a general control/operation unit 218 that performs various calculation and controls the entire digital still camera and a timing generation unit 220 that outputs various timing signals to the imaging device 201 and the signal processing unit 208. Here, the timing signal or the like may be input from the outside, and the imaging system 200 may include at least the imaging device 201 and the signal processing unit 208 that processes an output signal output from the imaging device 201.

The imaging device 201 outputs an imaging signal to the signal processing unit 208. The signal processing unit 208 performs predetermined signal processing on an imaging signal output from the imaging device 201 and outputs image data. The signal processing unit 208 uses an imaging signal to generate an image.

As described above, according to the present embodiment, the imaging system to which the photoelectric conversion device 100 according to any of the first to tenth embodiments is applied can be realized.

Twelfth Embodiment

Figure 29A:
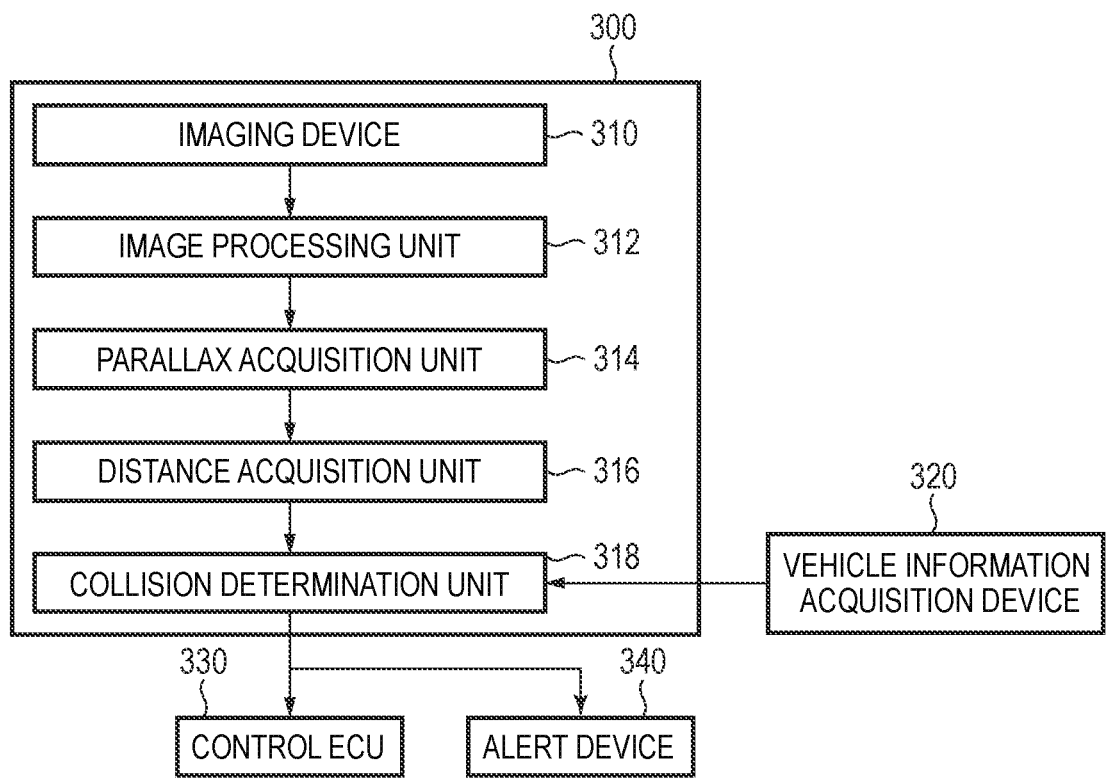
FIG. 29A is a diagram illustrating a configuration example of an imaging system according to a twelfth embodiment of the present invention.
Figure 29B:
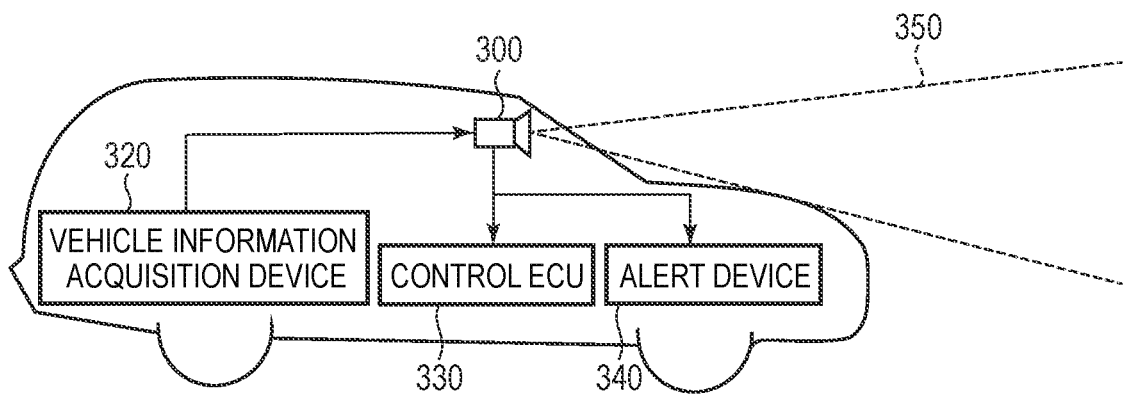
FIG. 29B is a diagram illustrating a configuration example of a movable object according to the twelfth embodiment of the present invention.

An imaging system and a movable object according to a twelfth embodiment of the present invention will be described with reference to FIG. 29A and FIG. 29B. FIG. 29A is a diagram illustrating a configuration of the imaging system according to the present embodiment. FIG. 29B is a diagram illustrating a configuration of the movable object according to the present embodiment.

FIG. 29A illustrates an example of an imaging system related to an on-vehicle camera. An imaging system 300 includes an imaging device 310. The imaging device 310 is the photoelectric conversion device 100 described in any of the above first to tenth embodiments. The imaging system 300 includes an image processing unit 312 that performs image processing on a plurality of image data acquired by the imaging device 310 and a parallax acquisition unit 314 that calculates a parallax (a phase difference of parallax images) from the plurality of image data acquired by the imaging system 300. Further, the imaging system 300 includes a distance acquisition unit 316 that calculates a distance to the object based on the calculated parallax and a collision determination unit 318 that determines whether or not there is a collision possibility based on the calculated distance. Here, the parallax acquisition unit 314 and the distance acquisition unit 316 are an example of a distance information acquisition unit that acquires distance information on the distance to the object. That is, the distance information is information on a parallax, a defocus amount, a distance to an object, or the like. The collision determination unit 318 may use any of the distance information to determine the collision possibility. The distance information acquisition unit may be implemented by dedicatedly designed hardware or may be implemented by a software module. Further, the distance information acquisition unit may be implemented by a field programmable gate array (FPGA), an application specific integrated circuit (ASIC), or the like or may be implemented by a combination thereof.

The imaging system 300 is connected to the vehicle information acquisition device 320 and can acquire vehicle information such as a vehicle speed, a yaw rate, a steering angle, or the like. Further, the imaging system 300 is connected to a control ECU 330, which is a control device that outputs a control signal for causing a vehicle to generate braking force based on a determination result by the collision determination unit 318. Further, the imaging system 300 is also connected to an alert device 340 that issues an alert to the driver based on a determination result by the collision determination unit 318. For example, when the collision probability is high as the determination result of the collision determination unit 318, the control ECU 330 performs vehicle control to avoid a collision or reduce damage by applying a brake, pushing back an accelerator, suppressing engine power, or the like. The alert device 340 alerts a user by sounding an alert such as a sound, displaying alert information on a display of a car navigation system or the like, providing vibration to a seat belt or a steering wheel, or the like.

In the present embodiment, an area around a vehicle, for example, a front area or a rear area is captured by using the imaging system 300. FIG. 29B illustrates the imaging system when a front area of a vehicle (a capturing area 350) is captured. The vehicle information acquisition device 320 transmits an instruction to the imaging system 300 or the imaging device 310. Such a configuration can further improve the ranging accuracy.

Although the example of control for avoiding a collision to another vehicle has been described above, the embodiment is applicable to automatic driving control for following another vehicle, automatic driving control for not going out of a traffic lane, or the like. Furthermore, the imaging system is not limited to a vehicle such as the subject vehicle and can be applied to a movable object (moving apparatus) such as a ship, an airplane, or an industrial robot, for example. In addition, the imaging system can be widely applied to a device which utilizes object recognition, such as an intelligent transportation system (ITS), without being limited to movable objects.

Modified Embodiments

The present invention is not limited to the embodiments described above, and various modifications are possible.

For example, an example in which a part of the configuration of any of the embodiments is added to another embodiment or an example in which a part of the configuration of any of the embodiments is replaced with a part of the configuration of another embodiment is also one of the embodiments of the present invention.

Further, the pixel circuit illustrated in FIG. 2 is an example, and the circuit configuration of the pixel 12 is not limited thereto. For example, a single pixel 12 may include a plurality of photoelectric converters PD or may further include a holding portion that can hold charge in addition to the photoelectric converter PD and the floating diffusion portion FD.

Further, although the examples in which the present invention is applied to the photoelectric conversion device in the first to tenth embodiments have been illustrated, a comparator, an AD converter, or the like to which the present invention is applied can be realized.

Further, the photoelectric conversion device described in each of the above first to tenth embodiments can be configured as a device intended for acquisition of an image, that is, an imaging device. Alternatively, in a case of application to a device mainly intended for ranging as described in the above fourteenth embodiment, it is not necessarily required to output an image. In such a case, it can be said that such a device is a photoelectric conversion device that converts optical information into a predetermined electrical signal. The imaging device is one of the photoelectric conversion devices.

Further, the imaging systems illustrated in the above eleventh and twelfth embodiments are examples of an imaging system to which the photoelectric conversion device of the present invention may be applied, and an imaging system to which the photoelectric conversion device of the present invention can be applied is not limited to the configuration illustrated in FIG. 28 and FIG. 29A.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2020-030610, filed Feb. 26, 2020, which is hereby incorporated by reference herein in its entirety.

What is claimed is:

1. A comparator comprising:
   a comparison circuit including:
   a differential unit that compares an input signal with a reference signal and changes a level of a signal output to a first node in accordance with a result of comparison, and
   an amplifier unit that includes a first transistor whose control node is connected to the first node and a first current source as a load element connected to the first transistor, and outputs a signal in accordance with a potential of the first node to a second node; and
   a positive feedback circuit that is connected to the second node and a third node and changes a level of a signal at the third node at a rate higher than a change rate of a level of a signal at the second node in accordance with a change in a level of a signal at the second node,
   wherein the first transistor has a first conductivity type and includes a first main node connected to a first voltage node supplied with a first voltage and wherein the first current source is connected between a second voltage node supplied with a second voltage, which is different from the first voltage, and a second main node of the first transistor,
   wherein the positive feedback circuit includes a feedback unit that positively feeds back a signal in accordance with a potential of the third node to the second node,
   wherein the comparator further comprises:
   a pad electrode used for supplying the second voltage;
   a third interconnection connected between the pad electrode and the second voltage node; and a fourth interconnection connected between the pad electrode and the fourth voltage node.

2. A comparator comprising:
a comparison circuit including:
a differential unit that compares an input signal with a reference signal and changes a level of a signal output to a first node in accordance with a result of comparison, and
an amplifier unit that includes a first transistor whose control node is connected to the first node and a first current source as a load element connected to the first transistor, and outputs a signal in accordance with a potential of the first node to a second node; and
a positive feedback circuit that is connected to the second node and a third node and changes a level of a signal at the third node at a rate higher than a change rate of a level of a signal at the second node in accordance with a change in a level of a signal at the second node,
wherein the first transistor has a first conductivity type and includes a first main node connected to a first voltage node supplied with a first voltage and wherein the first current source is connected between a second voltage node supplied with a second voltage, which is different from the first voltage, and a second main node of the first transistor,
wherein the positive feedback circuit includes a feedback unit that positively feeds back a signal in accordance with a potential of the third node to the second node,
wherein the feedback unit further includes a seventh transistor of a first conductivity type whose first main node is connected to a third voltage node supplied with the first voltage, and
an eighth transistor of the first conductivity type whose first main node is connected to a second main node of the seventh transistor, whose second main node is connected to the second node, and whose control node is connected to the third node,
wherein the comparator further comprises:
a pad electrode used for supplying the first voltage;
a first interconnection connected between the pad electrode and the first voltage node; and
a second interconnection connected between the pad electrode and the third voltage node.

3. A comparator comprising:
a comparison circuit including:
a differential unit that compares an input signal with a reference signal and changes a level of a signal output to a first node in accordance with a result of comparison, and
an amplifier unit that includes a first transistor whose control node is connected to the first node and a first current source as a load element connected to the first transistor, and outputs a signal in accordance with a potential of the first node to a second node; and
a positive feedback circuit that is connected to the second node and a third node and changes a level of a signal at the third node at a rate higher than a change rate of a level of a signal at the second node in accordance with a change in a level of a signal at the second node,
wherein the first transistor has a first conductivity type and includes a first main node connected to a first voltage node supplied with a first voltage and wherein the first current source is connected between a second voltage node supplied with a second voltage, which is different from the first voltage, and a second main node of the first transistor,
wherein the positive feedback circuit includes a feedback unit that positively feeds back a signal in accordance with a potential of the third node to the second node,
wherein the feedback unit further includes a ninth transistor of a second conductivity type whose first main node is connected to the second node, and
a tenth transistor of the second conductivity type whose first main node is connected to a second main node of the ninth transistor, whose second main node is connected to a fourth voltage node supplied with the second voltage, and whose control node is connected to the third node,
wherein the comparator further comprises:
a third pad electrode and a fourth pad electrode used for supplying the second voltage;
a third interconnection connected between the third pad electrode and the fourth voltage node; and
a fourth interconnection connected between the fourth pad electrode and the second voltage node.

4. The comparator according to claim 1, wherein the first current source includes a second transistor that forms a gate grounded circuit and whose control node is supplied with a bias voltage that is different from a reference voltage.

5. The comparator according to claim 4, wherein the first current source further includes a bias hold capacitor connected to the control node of the second transistor.

6. The comparator according to claim 1, wherein the amplifier unit of the comparison circuit includes a first transistor of a first conductivity type whose first main node is connected to a first voltage node supplied with a first voltage and whose control node is connected to the first node and a resistor connected between a second voltage node supplied with a second voltage, which is different from the first voltage, and a second main node of the first transistor.

7. The comparator according to claim 1, wherein the amplifier unit of the comparison circuit further includes a third transistor of the first conductivity type whose first main node is connected to the first voltage node and whose control node is connected to the second node and a second current source load connected between a second main node of the third transistor and the second voltage node.

8. The comparator according to claim 7, wherein the amplifier unit of the comparison circuit further includes a fourth transistor of the first conductivity type connected between the first main node of the third transistor and the first voltage node.

9. The comparator according to claim 1, wherein the third node is an output node of the positive feedback circuit.

10. The comparator according to claim 1, wherein the positive feedback circuit includes an amplifier unit that outputs a signal in accordance with a potential of the second node to the third node and a feedback unit that positively feeds back a signal in accordance with a potential of the third node to the second node.

11. The comparator according to claim 10, wherein the second node is an output node of the positive feedback circuit.

12. The comparator according to claim 10, wherein the amplifier unit of the positive feedback circuit further includes a fifth transistor of a first conductivity type whose first main node is connected to a third voltage node supplied with the first voltage and whose control node is connected to the second node and a third current source load connected between a fourth voltage node supplied with the second voltage and a second main node of the fifth transistor.

13. The comparator according to claim 12, wherein the amplifier unit of the positive feedback circuit further includes a sixth transistor of the first conductivity type connected between the first main node of the fifth transistor and the third voltage node.

14. The comparator according to claim 1, wherein the feedback unit further includes a seventh transistor of a first conductivity type whose first main node is connected to a third voltage node supplied with the first voltage, and
an eighth transistor of the first conductivity type whose first main node is connected to a second main node of the seventh transistor, whose second main node is connected to the second node, and whose control node is connected to the third node.

15. The comparator according to claim 1, wherein the feedback unit further includes a ninth transistor of a second conductivity type whose first main node is connected to the second node, and
a tenth transistor of the second conductivity type whose first main node is connected to a second main node of the ninth transistor, whose second main node is connected to a fourth voltage node supplied with the second voltage, and whose control node is connected to the third node.

16. The comparator according to claim 1, wherein the first voltage is a power supply voltage, and the second voltage is a reference voltage.

17. The comparator according to claim 1, wherein the comparison circuit includes a clamp capacitor provided to a node to which the input signal is input and a clamp capacitor provided to a node to which the reference signal is input.

18. The comparator according to claim 2, wherein the first current source includes a second transistor that forms a gate grounded circuit and whose control node is supplied with a bias voltage that is different from a reference voltage.

19. The comparator according to claim 18, wherein the first current source further includes a bias hold capacitor connected to the control node of the second transistor.

20. The comparator according to claim 2, wherein the amplifier unit of the comparison circuit includes a first transistor of a first conductivity type whose first main node is connected to a first voltage node supplied with a first voltage and whose control node is connected to the first node and a resistor connected between a second voltage node supplied with a second voltage, which is different from the first voltage, and a second main node of the first transistor.

21. The comparator according to claim 2, wherein the amplifier unit of the comparison circuit further includes a third transistor of the first conductivity type whose first main node is connected to the first voltage node and whose control node is connected to the second node and a second current source load connected between a second main node of the third transistor and the second voltage node.

22. The comparator according to claim 21, wherein the amplifier unit of the comparison circuit further includes a fourth transistor of the first conductivity type connected between the first main node of the third transistor and the first voltage node.

23. The comparator according to claim 2, wherein the third node is an output node of the positive feedback circuit.

24. The comparator according to claim 2, wherein the positive feedback circuit includes an amplifier unit that outputs a signal in accordance with a potential of the second node to the third node and a feedback unit that positively feeds back a signal in accordance with a potential of the third node to the second node.

25. The comparator according to claim 24, wherein the second node is an output node of the positive feedback circuit.

26. The comparator according to claim 3, wherein the first current source includes a second transistor that forms a gate grounded circuit and whose control node is supplied with a bias voltage that is different from a reference voltage.

27. The comparator according to claim 26, wherein the first current source further includes a bias hold capacitor connected to the control node of the second transistor.

28. The comparator according to claim 3, wherein the amplifier unit of the comparison circuit includes a first transistor of a first conductivity type whose first main node is connected to a first voltage node supplied with a first voltage and whose control node is connected to the first node and a resistor connected between a second voltage node supplied with a second voltage, which is different from the first voltage, and a second main node of the first transistor.

29. The comparator according to claim 3, wherein the amplifier unit of the comparison circuit further includes a third transistor of the first conductivity type whose first main node is connected to the first voltage node and whose control node is connected to the second node and a second current source load connected between a second main node of the third transistor and the second voltage node.

30. The comparator according to claim 29, wherein the amplifier unit of the comparison circuit further includes a fourth transistor of the first conductivity type connected between the first main node of the third transistor and the first voltage node.

31. The comparator according to claim 3, wherein the third node is an output node of the positive feedback circuit.

32. The comparator according to claim 3, wherein the positive feedback circuit includes an amplifier unit that outputs a signal in accordance with a potential of the second node to the third node and a feedback unit that positively feeds back a signal in accordance with a potential of the third node to the second node.

33. The comparator according to claim 32, wherein the second node is an output node of the positive feedback circuit.

34. An analog-to-digital converter comprising:
the comparator according to claim 1; and
a counter circuit that outputs, as digital data of the input signal, a count value in accordance with a length of a period from start of comparison between the input signal and the reference signal to a change of a level of the signal output to the first node.

35. An analog-to-digital converter comprising:
the comparator according to claim 2; and
a counter circuit that outputs, as digital data of the input signal, a count value in accordance with a length of a period from start of comparison between the input signal and the reference signal to a change of a level of the signal output to the first node.

36. An analog-to-digital converter comprising:
the comparator according to claim 3; and
a counter circuit that outputs, as digital data of the input signal, a count value in accordance with a length of a period from start of comparison between the input signal and the reference signal to a change of a level of the signal output to the first node.

37. A photoelectric conversion device comprising:
a plurality of pixels arranged so as to form a plurality of rows and a plurality of columns and each including a photoelectric converter;
a plurality of output lines each arranged on each of the plurality of columns and each connected to pixels on a corresponding column; and a plurality of analog-to-digital converters according to claim 34 each connected to each of the plurality of output lines and configured to perform analog-to-digital conversion on pixel signals output from pixels on a corresponding column.

38. A photoelectric conversion device comprising:

a plurality of pixels arranged so as to form a plurality of rows and a plurality of columns and each including a photoelectric converter;

a plurality of output lines each arranged on each of the plurality of columns and each connected to pixels on a corresponding column; and a plurality of analog-to-digital converters according to claim 35 each connected to each of the plurality of output lines and configured to perform analog-to-digital conversion on pixel signals output from pixels on a corresponding column.

39. A photoelectric conversion device comprising:

a plurality of pixels arranged so as to form a plurality of rows and a plurality of columns and each including a photoelectric converter;

a plurality of output lines each arranged on each of the plurality of columns and each connected to pixels on a corresponding column; and a plurality of analog-to-digital converters according to claim 36 each connected to each of the plurality of output lines and configured to perform analog-to-digital conversion on pixel signals output from pixels on a corresponding column.

40. An imaging system comprising:

the photoelectric conversion device according to claim 37; and a signal processing unit that processes a signal output from the photoelectric conversion device.

41. An imaging system comprising:

the photoelectric conversion device according to claim 38; and a signal processing unit that processes a signal output from the photoelectric conversion device.

42. An imaging system comprising:

the photoelectric conversion device according to claim 39; and a signal processing unit that processes a signal output from the photoelectric conversion device.

43. A movable object comprising:

the photoelectric conversion device according to claim 37;

a distance information acquisition unit that acquires distance information on a distance to an object, from a parallax image based on signals from the photoelectric conversion device; and a control unit that controls the movable object based on the distance information.

44. A movable object comprising:

the photoelectric conversion device according to claim 38;

a distance information acquisition unit that acquires distance information on a distance to an object, from a parallax image based on signals from the photoelectric conversion device; and a control unit that controls the movable object based on the distance information.

45. A movable object comprising:

the photoelectric conversion device according to claim 38;

a distance information acquisition unit that acquires distance information on a distance to an object, from a parallax image based on signals from the photoelectric conversion device; and a control unit that controls the movable object based on the distance information.

46. The photoelectric conversion device according to claim 1, wherein the first current source is an active load.

47. The photoelectric conversion device according to claim 1, wherein the second node is a connection node between the first transistor and the first current source.

48. The comparator according to claim 1, wherein the positive feedback circuit further includes an inverter that inverts a level of a signal at the second node and outputs the inverted level of the signal to the third node.

* * * * *